United States Patent
Stella et al.

(10) Patent No.: US 12,368,126 B2
(45) Date of Patent: Jul. 22, 2025

(54) HIGH THERMAL DISSIPATION, PACKAGED ELECTRONIC DEVICE AND MANUFACTURING PROCESS THEREOF

(71) Applicant: STMICROELECTRONICS S.r.l., Agrate Brianza (IT)

(72) Inventors: Cristiano Gianluca Stella, San Gregorio di Catania (IT); Roberto Rizza, Syracuse (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 462 days.

(21) Appl. No.: 17/553,540

(22) Filed: Dec. 16, 2021

(65) Prior Publication Data
US 2022/0199563 A1    Jun. 23, 2022

(30) Foreign Application Priority Data
Dec. 23, 2020 (IT) .................. 102020000032267

(51) Int. Cl.
| | |
|---|---|
| H01L 23/00 | (2006.01) |
| H01L 23/492 | (2006.01) |
| H01L 21/56 | (2006.01) |
| H01L 23/31 | (2006.01) |

(52) U.S. Cl.
CPC .......... H01L 24/20 (2013.01); H01L 23/4922 (2013.01); H01L 24/19 (2013.01);
(Continued)

(58) Field of Classification Search
CPC ..... H01L 24/20; H01L 23/4922; H01L 24/19; H01L 21/56; H01L 23/3121; H01L 24/32; H01L 2224/32245
See application file for complete search history.

(56) References Cited

U.S. PATENT DOCUMENTS

2002/0109211 A1    8/2002    Shinohara
2004/0219718 A1    11/2004    Quah
(Continued)

FOREIGN PATENT DOCUMENTS

| CN | 104218007 A | 12/2014 |
|---|---|---|
| IT | 102018000004209 A1 | 4/2018 |
| WO | WO 2006058030 A2 | 6/2006 |

OTHER PUBLICATIONS

Infineon, "TO-Leaded Topside-Cooled (TOLT) Package Automotive Power Mosfet," Z8F80044621, Version 1.1, Apr. 7, 2021, retrieved Feb. 25, 2025, from URL=https://www.infineon.com/cms/en/product/gated-document/to-leaded-topside-cooled-tolt-package-power-mosfet-5546d46278d64ffd01790dccfd10480f/, 19 pages.
(Continued)

*Primary Examiner* — Fernando L Toledo
*Assistant Examiner* — Neil R Prasad
(74) *Attorney, Agent, or Firm* — SEED IP LAW GROUP LLP

(57) ABSTRACT

The packaged power electronic device has a bearing structure including a base section and a transverse section extending transversely to the base section. A die is bonded to the base section of the bearing structure and has a first terminal on a first main face and a second and a third terminal on a second main face. A package of insulating material embeds the semiconductor die, the second terminal, the third terminal and at least partially the carrying base. A first, a second and a third outer connection region are electrically coupled to the first, the second and the third terminals of the die, respectively, and are laterally surrounded by the package and face the second main surface of the package. The transverse section of the bearing structure extends from the base section towards the second main surface of the package and has a higher height with respect to the die.

28 Claims, 18 Drawing Sheets

(52) U.S. Cl.
CPC .......... *H01L 21/56* (2013.01); *H01L 23/3121* (2013.01); *H01L 24/32* (2013.01); *H01L 2224/32245* (2013.01)

(56) References Cited

U.S. PATENT DOCUMENTS

| | | | |
|---|---|---|---|
| 2004/0266037 | A1 | 12/2004 | Knapp et al. |
| 2008/0233679 | A1 | 9/2008 | Luo et al. |
| 2010/0019381 | A1 | 1/2010 | Haeberlen et al. |
| 2010/0032819 | A1 | 2/2010 | Liu et al. |
| 2010/0164078 | A1* | 7/2010 | Madrid ............... H01L 24/37 438/122 |
| 2011/0198743 | A1 | 8/2011 | Nikitin et al. |
| 2018/0138136 | A1* | 5/2018 | Tonegawa ......... H01L 23/49524 |
| 2019/0311976 | A1 | 10/2019 | Salamone et al. |
| 2019/0355643 | A1 | 11/2019 | Hong et al. |

OTHER PUBLICATIONS

Di Paolo Emilio, Maurizio, "Power Solutions for Thermal and Motor Management," Power Electronics News, published Jun. 14, 2021, retrieved Feb. 25, 2025, from URL=https://www.powerelectronicsnews.com/power-solutions-for-thermal-and-motor-management/, 8 pages.

Infineon, "Double DPAK: first top-side cooled SMD solution for high power applications," published Jun. 4, 2018, retrieved Feb. 25, 2025, from URL=https://www.infineon.com/cms/en/about-infineon/press/market-news/2018/INFPMM201806-057.html, 2 pages.

Infineon, "MOSFET 600V CoolMOS G7 SJ Power Device," IPDD60R102G7, Final Data Sheet Rev. 2.1, Oct. 27, 2020, retrieved Feb. 25, 2025, from URL=https://pdf1.alldatasheet.com/datasheet-pdf/view/1031243/INFINEON/IPDD60R102G7.html, 14 pages.

Infineon, "D-DPAK & Q-DPAK," 500V-950V N-Channel Power MOSFET, retrieved Feb. 25, 2025, from URL=https://www.infineon.com/cms/en/product/power/mosfet/n-channel/500v-950v/coolmos-latest-packages/double-dpak-ddpak/, 6 pages.

Makus, et al., "JEDEC Registration of SMD Top Side Cooling Packages," Infineon Feb. 9, 2023, retrieved Feb. 25, 2025, from URL=https://www.infineon.com/cms/en/about-infineon/press/market-news/2023/INFPSS202302-057.html, 12 pages.

\* cited by examiner

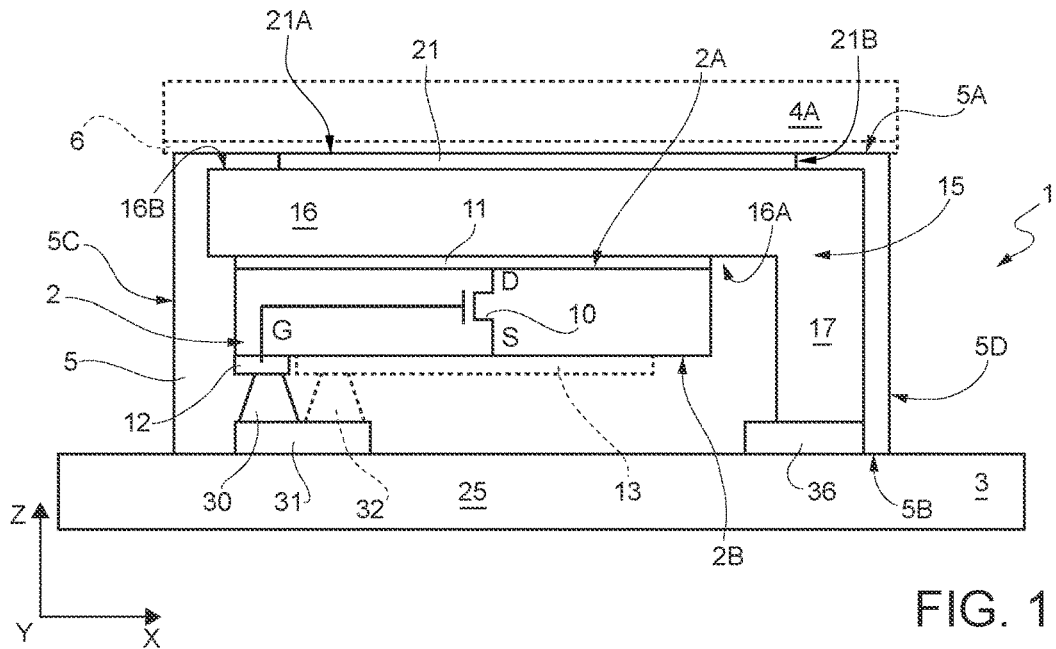
FIG. 1
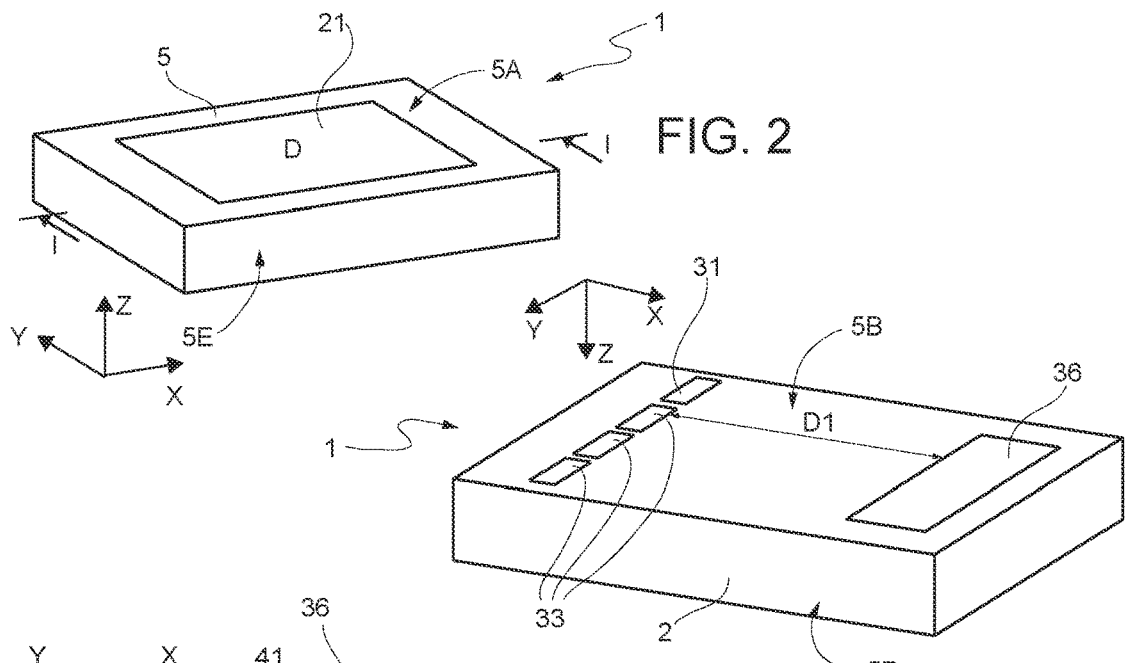
FIG. 2
FIG. 3
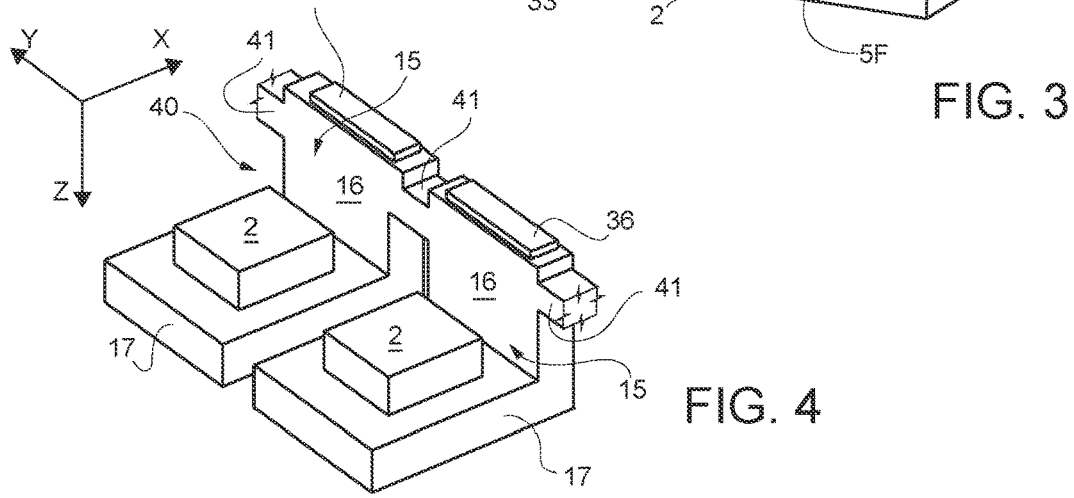
FIG. 4

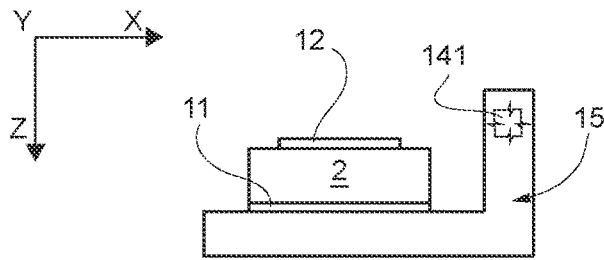
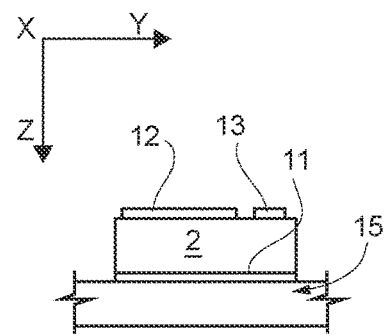
FIG. 11A FIG. 12A
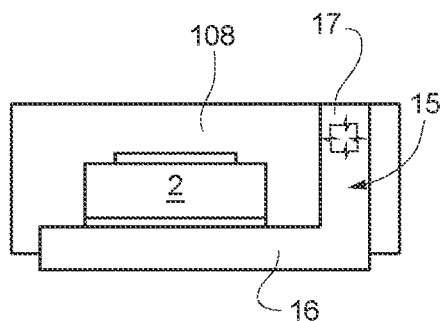
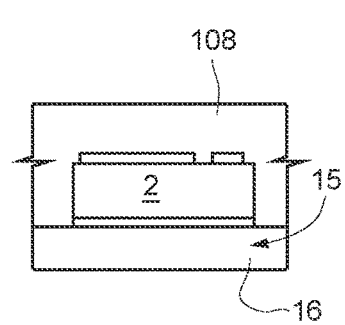
FIG. 11B FIG. 12B
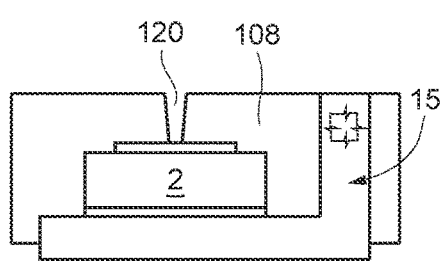
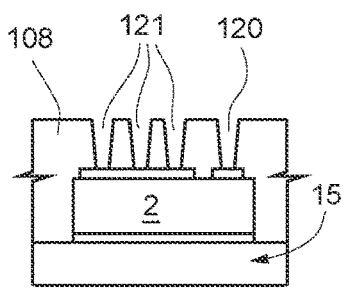
FIG. 11C FIG. 12C
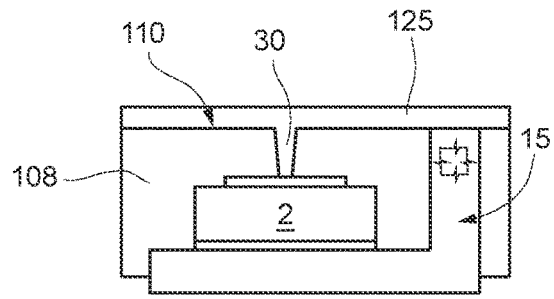
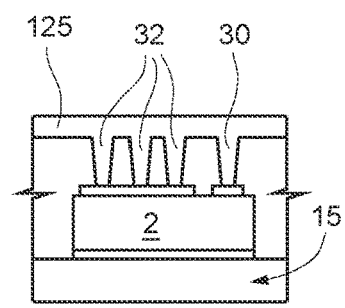
FIG. 11D FIG. 12D

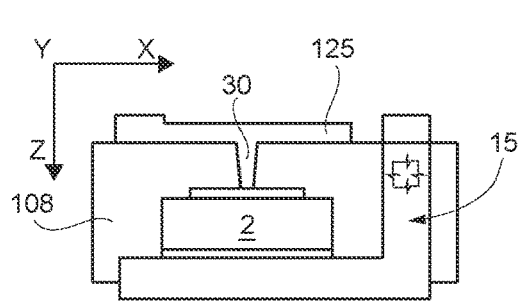
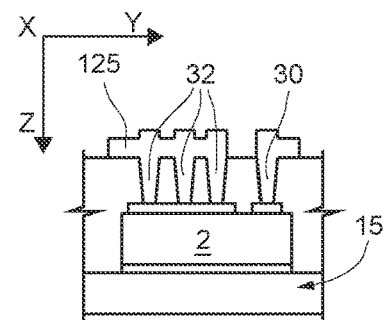
FIG. 11E    FIG. 12E
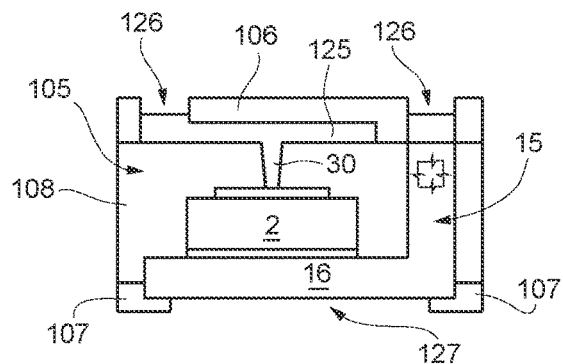
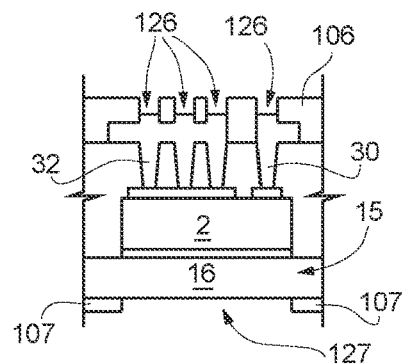
FIG. 11F    FIG. 12F
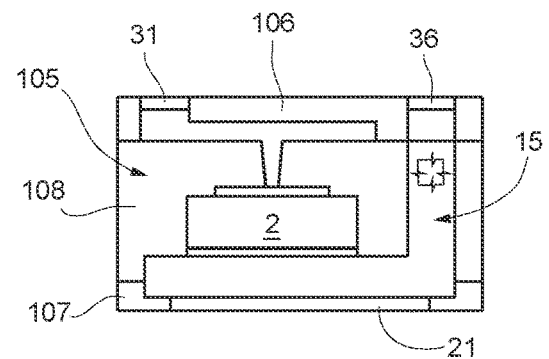
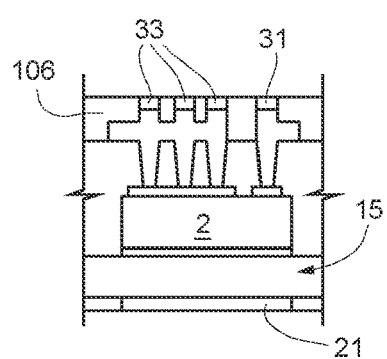
FIG. 11G    FIG. 12G
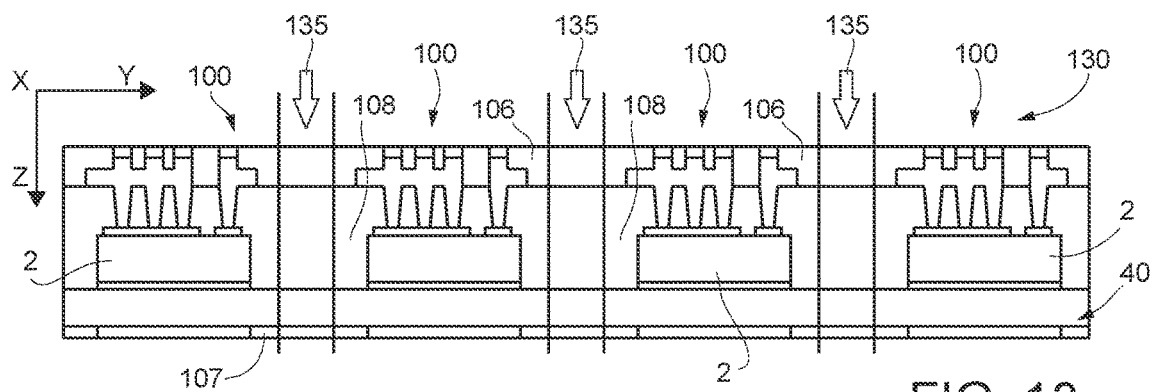
FIG. 13

HIGH THERMAL DISSIPATION, PACKAGED ELECTRONIC DEVICE AND MANUFACTURING PROCESS THEREOF

BACKGROUND

Technical Field

The present disclosure relates to a high thermal dissipation, packaged electronic device and to the manufacturing process thereof. In particular, the present disclosure refers to a high voltage and/or high power semiconductor device, such as a MOSFET transistor or an Insulated Gate Bipolar Transistor (IGBT), having a double exposure face. For example, the MOSFET device may be of the superjunction (also called "charge-balance") type.

Description of the Related Art

As is known, high voltage and/or high current power semiconductor devices are widely used in applications, for example of power conversion, where they are subject to high or very high voltage biases (with values even up to 1000-2000 V) and are passed by currents that may switch rapidly.

In these devices, special measures are therefore desired for forming the package, so as to provide a high electrical insulation, a suitable separation distance between the leads associated with gate, source and drain terminals, and a high heat dissipation to the outside.

Power semiconductor devices (MOSFETs or IGBTs in case of silicon substrates) of this type are formed in a die of semiconductor material (typically silicon, silicon carbide, silicon and gallium nitride —GaN— or gallium nitride only) which has a first main surface where a drain pad extends, and a second main surface, opposite to the first main surface, where source and gate pads extend.

The die is bonded to a conductive support called "leadframe", provided with drain, source and gate leads for outer connection of the device. To this end, the drain pad is generally bonded to a bearing portion of the leadframe, which also has a heat dissipation function; gate and source leads are coupled to the gate and, respectively, source pads through bonding wires or clamps or clips. The die/leadframe assembly is packaged in a mass of resin or other package insulating material. The package insulating material may be molded or laminated.

Traditional packages for power semiconductor devices are generally arranged vertically and comprise pins projecting downwards from a single bottom side of the package structure (generally of a parallelepiped shape), for electrical coupling to a Printed Circuit Board (PCB). A suitable heat sink, typically a metal foil, is coupled to the package structure, also arranged vertically with respect to the printed circuit board.

To obtain increasingly compact size as regards thickness, horizontal packages, for example of the Surface Mounting Device (SMD) type, which allow also a Dual Side Cooling (DSC), have been developed.

For example, Italian patent 102018000004209 (corresponding to publication US 2019/0311976) describes a solution where the die has a plurality of projecting gate regions, mutually separated by windows having source contact regions arranged therein. A dissipative plate, formed by an insulating multilayer, is arranged above the die and comprises a bottom metal layer counter-shaped to the projecting gate regions and having contact projections extending within the windows and electrically contacting the source contact regions.

The solution described above has a very compact structure even for power devices operating at high voltage (up to 1600-2000 V), with possible cooling on both sides and electrical insulation on one or two bigger sides, but it is quite complex to manufacture and requires a specific layout for each die size.

US2004266037 discloses a direct chip attach structure having a bearing structure including a base section and a transverse section. The transverse section extends for a reduced portion of the package height and has not thermal function; the connection regions are extend at a distance from the package face and holes are formed for accommodating external solder balls.

US2011198743 and US2010019381 disclose semiconductor devices having an L-shaped bearing structure and contact regions protruding from the package.

US2008233679 discloses a semiconductor package having a metal clip or plate for connecting the bottom side of the chip to the outside.

WO2006058030 discloses a semiconductor package formed of an upper and a lower leadframe

BRIEF SUMMARY

The present disclosure provides a high voltage and/or high power packaged device which overcomes the drawbacks of the prior art.

According to the present disclosure, a packaged electronic device and a manufacturing process thereof are provided.

In at least one embodiment, a device, which may be a package power electronic device, includes a support structure including a base section and a transverse section extending transversely to the base section. The base section having a first face and a second face opposite to the first face. A die is coupled to the first face of the base section of the support structure and the die has a first and a second main face. A height of the die extends from the first main face to the second main face. A conductive layer is on the second face of the base section. A first, a second and a third terminal, the first terminal are on the first main face of the die and the second and third terminals are on the second main face of the die. One or more layers of insulating material is around and embeds the die, the second terminal, the third terminal and the base section.

The device further includes one or more layers of insulating materials around and embedding the die, the second terminal, the third terminal and the base section. A first main surface at which at least one of the one or more layers of insulating materials is present. A second main surface opposite to the first main surface at which at least one of the one or more layers of the insulating material is present. A first, a second and a third outer connection region electrically coupled to the first, the second and the third terminals respectively, the first, the second and the third outer connection regions being laterally surrounded by the one or more layers of insulating materials and facing the second main surface. The transverse section of the support structure extends from the base section towards the second main surface, has a first height greater than a second height of the die, and is in contact with the first outer connection region.

In at least one embodiment, a packaged power electronic device described below comprises: a bearing structure including a base section and a transverse section, the base section having a first and a second face and the transverse section extending transversely to the base section; a die bonded to the first face of the base section of the bearing structure, the die having a first and a second main face and a height between the first and the second main faces; a first, a second and a third terminal, the first terminal extending on the first main face of the die and the second and third terminals extending on the second main face of the die; a package of insulating material, embedding the semiconductor die, the second terminal, the third terminal and at least partially the carrying base, the package having a first and a second main surface; a first, a second and a third outer connection region electrically coupled to the first, the second and the third terminals respectively, the first, the second and the third outer connection regions being laterally surrounded by the package and facing the second main surface of the package, wherein the transverse section of the bearing structure extends from the base section towards the second main surface of the package and has a higher height with respect to the die.

In at least one embodiment, the transverse section may form the third outer connection region and be flush with the second main surface of the package. In the alternative, the transverse section may be in contact with the first outer connection region and the first outer connection region may be flush with the second main surface of the package.

In at least one embodiment, the packaged power electronic device may comprise a connection structure of electrically conductive material extending through the package and coupling the second terminal and the third terminal to the second and, respectively, to the third outer connection regions.

The package may be of molded or laminated type.

In at least one embodiment, a process for manufacturing at least one embodiment of a packaged power electronic device described below comprises: bonding a die to a bearing structure having a base section and a transverse section, the die having a first and a second main face, a first terminal on the first main face and a second and a third terminal on the second main face of the die, the die having the second main face bonded to the base section of the bearing structure, thereby the transverse section of the bearing structure projects in height with respect to the die; and forming a package of insulating material embedding the die and, at least partially, the bearing structure, wherein forming a package includes laterally surrounding a first, a second and a third outer connection region electrically coupled to the first, the second and the third terminals, respectively, thereby the first, the second and the third outer connection regions face the first main surface of the package.

In at least one embodiment, forming a package may comprise bonding the first outer connection region to the base section of each bearing structure; arranging the second and the third outer connection regions in a mold and molding the package.

In at least one embodiment, forming a package may comprise forming, through lamination, a packaging region embedding the die and, at least partially, the bearing structure and having a first and a second face; forming holes in the packaging region through the first face of the bearing structure up to the second and the third terminals; forming connection regions of conductive material in the holes and on the second face of the packaging region; forming a first and a second insulating layer above the second and, respectively, the first faces of the packaging region, the first insulating layer having a second and a third connection opening at the second and, respectively, the third terminals and the second insulating layer having a first connection opening at the first terminal; and forming the first, the second and the third outer connection regions in the connection openings.

In at least one embodiment, forming a package may comprise forming a packaging region embedding the die and, at least partially, the bearing structure and having a first and a second face, wherein the transverse section may form the third outer connection region and be flush with the second main surface of the package. In the alternative, the transverse section may have a smaller height than the package and be in contact with the first outer connection region, with the first outer connection region flush with the second main surface of the package.

BRIEF DESCRIPTION OF THE SEVERAL VIEWS OF THE DRAWINGS

For a better understanding of the present disclosure, some embodiments thereof are now described, purely by way of non-limiting example, with reference to the accompanying drawings, wherein:

FIG. 1 is a cross-section of an embodiment of the present power device, taken along section line I-I of FIG. 2 and relating to a first shape of a part of the device (support structure or "leadframe");

FIG. 2 is a perspective top view of the power device of FIG. 1;

FIG. 3 is a schematic bottom view of the power device of FIG. 1;

FIG. 4 is a perspective top view of a portion of a multiple support structure used for a plurality of power devices, for example of the type shown in FIGS. 1-3, in an intermediate manufacturing step;

FIGS. 11A-11G are cross-sections, similar to FIG. 8, in successive manufacturing steps of the power device of FIGS. 8-10;

FIGS. 12A-12G are cross-sections taken on a section plane perpendicular to FIGS. 11A-11G, in the manufacturing steps indicated by the same letters A-G, of the power device of FIGS. 8-10;

FIG. 13 is a cross-section similar to FIGS. 12A-12G after the forming the leads, for a multiple support structure, prior to cutting;

DETAILED DESCRIPTION

Figure 5:
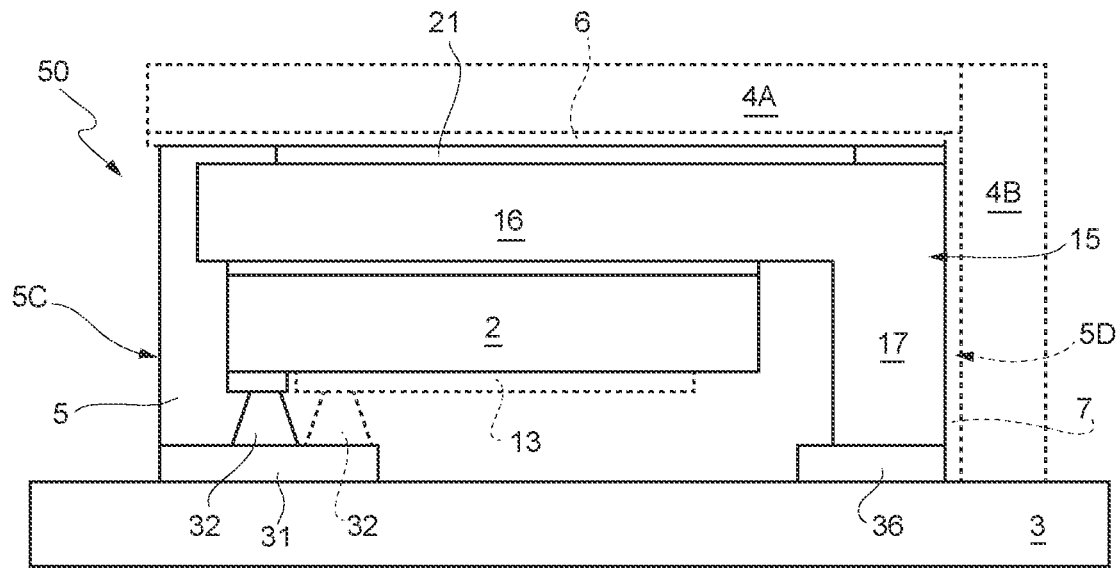
FIG. 5 is a cross-section of another embodiment of the present power device, taken along a section line similar to that of FIG. 1, and relating to the first shape of the leadframe.

FIGS. 1-3 show a power device 1, of semiconductor material, such as a MOSFET (metal oxide semiconductor field-effect transistor) or IGBT (insulated-gate bipolar transistor), of Dual Side Cooling (DSC) type, with a first type of leadframe, with molded package and without projecting leads (leadless solution).

The power device 1 is integrated in a die 2, represented only schematically, and having a first and a second face 2A, 2B, opposite to each other. The first and second faces 2A, 2B may be referred to as surfaces.

The die 2 is formed, in a known and not-represented manner, by a semiconductor body, formed by processing a substrate of silicon carbide or silicon and/or gallium nitride, and incorporating conductive regions, insulating regions, and suitably doped regions, in a manner known to a person skilled in the art.

In the example considered, the die 2 integrates a transistor 10, for example a MOSFET or IGBT, at high voltage, represented only through an equivalent electric diagram, and having source terminal S, drain terminal D and gate terminal G. The transistor 10 may for example be of superjunction type, formed by a plurality of elementary units connected in parallel with each other, in a manner not shown and known to a person skilled in the art.

The drain terminal D is formed by a drain contact region 11, generally of metal such as aluminum, extending on the first face 2A of the die 2. The gate terminal G is formed by a gate contact region 12 generally of metal such as aluminum, extending on the second face 2B of the die 2. The source terminal S is formed by one or more source contact regions 13 (one represented dashed, as extending behind the section plane), generally of metal such as aluminum, formed on the second face 2B of the die 2.

The source 13 and gate contact regions 12 may have suitable shape and arrangement, according to the desired connection scheme, with the source contact regions 13 electrically insulated from the gate contact region 12.

A support or bearing structure (hereinafter called "leadframe") 15, of metal, is bonded to the drain contact region 11. For example, a conductive adhesive layer, such as a conductive solder, not shown, may be provided, which electrically and thermally connects the drain contact region 11 with the leadframe 15. The support structure 15 may be referred to as a bearing structure.

In the embodiment shown in FIGS. 1-3, the leadframe 15 has the shape of an inverted L that has a base section 16 (e.g., first portion) and a transverse section 17 (e.g., second portion). Both the base and transverse sections 16, 17 may have a thickness of about 100-200 microns. The base section 16 and the transverse section 17 are transverse to each other and may be substantially perpendicular to each other.

The base section 16 of the leadframe 15 has a generally rectangular outer shape (see also FIG. 4), extending mainly in an XY-plane of a Cartesian coordinate system XYZ having a first axis X (also referred to as the longitudinal or length direction), a second axis Y (also referred to as the width direction) and a third axis Z (also referred to as the thickness or height direction, FIG. 1). The base section 16 has a first and a second side 16A, 16B, which may be first and second surfaces of the base section 16, and is bonded to the drain contact region 11 on the first side 16A thereof through a conductive adhesive layer, not shown.

The base section 16 may or may not have a planar structure (for example the first side 16A thereof may be recessed), with a greater area with respect to the die 2 to form a carrying base for the die 2 itself.

The transverse section 17 extends transversely, in particular perpendicularly, to the base section 16, next to, but spaced from, the die 2. The transverse section 17 has a higher height (along the third axis Z of the Cartesian coordinate system XYZ, in FIG. 1) than the die 2, approximately equal to the overall height of the power device 1

(except for the thickness of the relative lead, as discussed hereinafter), to form a thermal flow path, as explained in more detail hereinafter.

The die 2 and the leadframe 15 are embedded in a package 5 of molded type formed by a region of resin or other electrically insulating material (e.g., encapuslant, molding compound, epoxy, etc.).

In the embodiment shown, the package 5 is generally parallelepiped, and has a first main surface 5A (arranged at the top in FIG. 1), a second main surface 5B (arranged at the bottom in FIG. 1) and four side walls 5C-5F. Here, a first and a second transverse wall 5C, 5D (parallel to a YZ-plane of the Cartesian coordinate system XYZ) are mutually spaced in the length direction of the power device 1 and a first and a second longitudinal wall 5E, 5F (parallel to an XZ-plane of the Cartesian coordinate system XYZ) are mutually spaced in the width direction of the power device 1.

In the embodiment shown, therefore, the main surfaces 5A and 5B are rectangular with long sides parallel to the first axis X.

The package 5 accommodates a front thermal dissipation region 21 extending between the first surface 5A of the package 5 and the second side 16B of the base section 16 of the leadframe 15. In the embodiment shown, the front thermal dissipation region 21 is level with the first main surface 5A of the package 5 (see also FIG. 2). For example, a surface 21A of the front thermal dissipation region 21 is substantially coplanar with a surface of the insulating material of the package 5.

The package accommodates the front thermal dissipation region 21 extending along the second side 16B (e.g., surface of the support structure 15 facing away from the die 2) of support structure. The insulating material of the package 5 covers sidewalls or ends 21B of the front thermal dissipation region 21.

The front thermal dissipation region 21 is of a material with good thermal conductivity and therefore thermally connects the leadframe 15 with the outside; for example, the front thermal dissipation region 21 may be of copper, or may comprise multiple layers of different materials, for example copper and conductive solder paste. The front dissipation region 21 may be referred to as a conductive layer, a thermally conductive layer, or some other type of reference referring to a material having good thermal conductivity.

In some applications, an electrically insulating, but good thermal conductive layer, covering the metal, may be provided. In another solution, the front thermal dissipation region 21 may comprise a nickel and gold layer, deposited through an ENIG (Electroless Nickel Immersion Gold) process, as discussed hereinafter with reference to FIGS. 11G, 12G.

The package 5 also accommodates a gate lead 31 and one or more source leads 33 of electrically conductive material. In the example considered, there are three source leads 33, see FIG. 3.

Furthermore, the package 5 accommodates a gate connection region 30 and one or more source connection regions 32 (here three, only one represented with dashed line in FIG. 1, as extending behind the section plane).

In detail, the gate lead 31 and the source leads 33 face the second main surface 5B of the package 5 (see also FIG. 2); the gate connection region 30 extends between the gate lead 31 and the gate contact region 12; and the source connection regions 32 extend between the source leads 33 and the respective source contact regions (or single region) 13.

In the embodiment shown, the gate 31 and source leads 33 are mutually aligned in the width direction (along the second axis Y of the Cartesian coordinate system XYZ) and are arranged in proximity to the first transverse wall 5C of package 5.

The gate 30 and source connection regions 32 are also of electrically conductive material, such as copper; they may be formed in a redistribution layer RDL or in any other known way and electrically connect the gate lead 31 with the gate contact region 12 and the source leads 33 with the source contact region(s) 13, respectively.

The transverse section 17 of the leadframe 15 extends towards the second main surface 5B of the package 5, up to in proximity thereof, and is in direct contact with a rear thermal dissipation region 36.

The rear thermal dissipation region 36 faces the second main surface 5B, in proximity to the second transverse wall 5D of the package 5 (see also FIG. 3).

The rear thermal dissipation region 36 is therefore in direct physical and electrical contact with the leadframe 15 and forms a drain lead (hereinafter it will therefore also be referred to as the drain lead 36).

The gate 31, source 33 and drain leads 36 extend here level with the second main surface 5B of the package 5; alternatively, they may be depressed with respect to this second main surface 5B. Furthermore, they are of electrically conductive material and may be formed by multiple layers, for example of nickel and gold, as described hereinafter with reference to FIGS. 11A-11G, 12A-12G.

In practice and as visible in FIG. 3, the gate 31 and source leads 32 are arranged longitudinally remote from the drain lead 36, and therefore at a large creepage distance D1. For example, with a power device 1 operating up to 850 V, the creepage distance D1 may be of 2.7 mm and with a power device 1 operating up to 1200 V, the creepage distance D1 may be of 3.5 mm.

As shown in FIG. 1, the power device 1 is here intended to be bonded with the second main surface 5B of the package 5 to a support 3, for example a printed circuit board, of insulating material, provided with conductive tracks and with contact regions at the gate 31, source 32 and drain leads 36, in a per se known manner.

Furthermore, in FIG. 1, a dissipative plate 4A is bonded to the first main surface 5A of the package 5 through an adhesive layer 6, for example a solder paste or a thin layer of a material which provides good electrical insulation and a high thermal conductivity. In this manner, the adhesive layer 6 allows a good thermal dissipation of the power device 1, and at the same time the electrical insulation of the dissipative plate 4A and the coplanarity in case of multiple power devices 1 having the same dissipative plate 4A placed thereon.

The leadframe 15 allows the drain terminal 11 of the transistor 10 to be electrically connected to the drain lead 36 placed on the same side of the gate 31 and source leads 32 (second main surface 5B of the package 5), and a thermal dissipation path to be created towards the front side of the transistor 10 (first main surface 5A of the package 5) through the front thermal dissipation region 21, and towards the rear side of the transistor 10 (second main surface 5B of the package 5) through the drain lead 36, thus obtaining an effective Dual Side Cooling (DSC).

The cooling effect may also be increased by the presence of the dissipative plate 4A.

Therefore, the power device 1 has a high thermal dissipation; furthermore, it may work at high voltage due to the large creepage distance D1 and may be formed in a simple manner, not requiring complex dissipation structures having specifically designed portions or clips, as described hereinafter.

The power device 1 may be obtained by mounting a plurality of dice 2 on respective leadframes 15 still connected to each other, for example aligned along a single direction (monodirectional leadframe string forming a multiple support structure 40, as shown in FIG. 4). The drain leads 36 of the several devices may also already be bonded on the single leadframes 15, as described hereinafter. Furthermore, in a not-shown manner, the front thermal dissipation regions 21 may already have been bonded on the second side 16B of the base section 16 of the leadframe 15.

In detail, in the multiple support structure 40 of FIG. 4, the leadframes 15 are arranged side by side and mutually connected by connection arms 41 which connect pairs of adjacent leadframes 15 at their transverse section 17.

In particular, here, the connection arms 41 extend in proximity to the top edges (in FIG. 4) of the transverse sections 17 of the leadframes 15, remote to the base sections 16 of the leadframes 15; alternatively, in this embodiment, they may be arranged at any height of the transverse sections 17, when allowed by considerations of distance between regions exposed to different voltage (creepage distance).

In FIG. 4 the drain leads 36, bonded on the transverse sections 17, are also visible.

The multiple support structure 40 may be obtained from a metal sheet, for example of copper, by etching the metal sheet according to known etching processes to obtain the desired configuration of the base sections 16 and of the transverse sections 17, and bonding the drain leads 36.

In this embodiment, after bonding the dice 2, the single leadframes 15 are divided; each leadframe 15, with its die 2, is inserted into a mold having the gate 31 and source leads 33 and the respective gate and source connection regions 30, 32, placed therein. Then, the package 5 is molded, obtaining the power device 1 of FIGS. 1-3.

As an alternative to the above, the power device 1 may be manufactured by molding a multiple package structure, which covers all the dice 2 and the leadframes 15, still joined, and separating the single power devices 1 by cutting. In this case, projections at the connection arms 41 may extend up to the surface of the package 5.

According to yet another embodiment, not shown, the multiple support structure may have a two-dimensional extension, array-like. Also in this case, the cutting of the leadframes may occur before or after molding the package 5.

Figure 6:
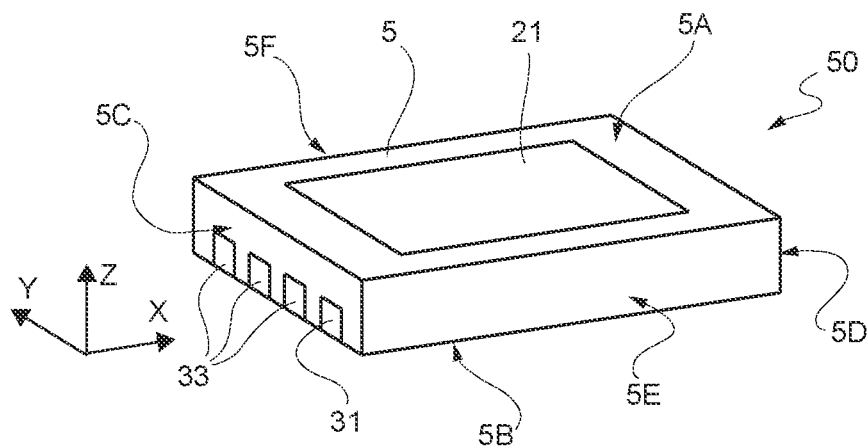
FIG. 6 is a perspective top view of the power device of FIG. 5.
Figure 7:
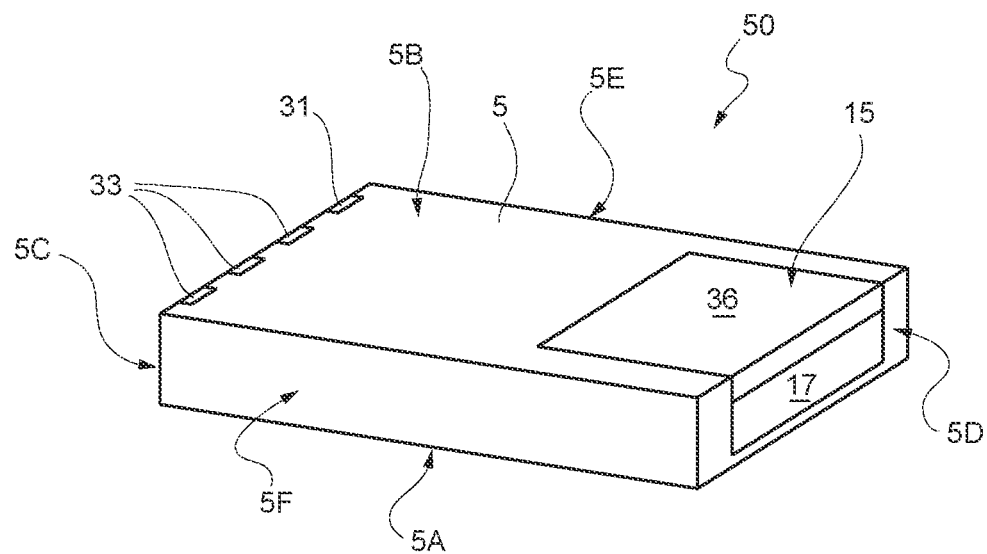
FIG. 7 is a schematic bottom view of the power device of FIG. 5.

FIGS. 5-7 show a power device 50 of Dual Side Cooling (DSC) type, with the same first leadframe type, molded package and projecting leads. Therefore, the power device 50 has a structure similar to the power device 1 of FIGS. 1-3, and will be described only with reference to the differences, using like reference numerals for like parts.

In detail, in the power device 50, the package 5 is molded so that the transverse section 17 of the leadframe 15 is exposed to the outside, level with the second transverse wall 5D, as also visible in FIG. 7.

Furthermore, in the power device 50, the gate 31 and source leads 33 extend up to the first transverse wall 5C of the package 5, and therefore have an exposed side that is level with the first transverse wall 5C.

In this embodiment, therefore, since the gate 30, source 33 and drain 36 leads face side walls (5C, 5D) of the package 5, soldering to the support 3 may also occur along these side walls 5C, 5D, and the solders may be easily viewed to verify the correctness and integrity thereof, as required in some applications, for example the automotive field.

Furthermore, here again the creepage distance D1 between the source leads 33 and the drain lead 36 is large, so that the power device 50 may work at very high voltages.

Furthermore, this embodiment is also characterized by an optimum cooling effect.

As for the power device 1, the power device 50 of FIGS. 5-8 may be provided with a dissipative plate (also called first dissipative plate) 4A which is bonded to the first main surface 5A of the package 5; furthermore, a second dissipative plate 4B may be bonded to the transverse section 17 through an own adhesive layer 7, for example a solder paste or a thin layer of a material having the characteristics indicated above for the adhesive layer 6.

The power device 50 of FIGS. 5-8 may be formed similarly to the power device 1, with a suitable configuration of the gate 31, source 34 and drain leads 36 and by suitably placing it in a mold for molding the package 5 and/or through special techniques to increase the exposure area on the first main surfaces 5A and on the second transverse walls 5D.

Figure 8:
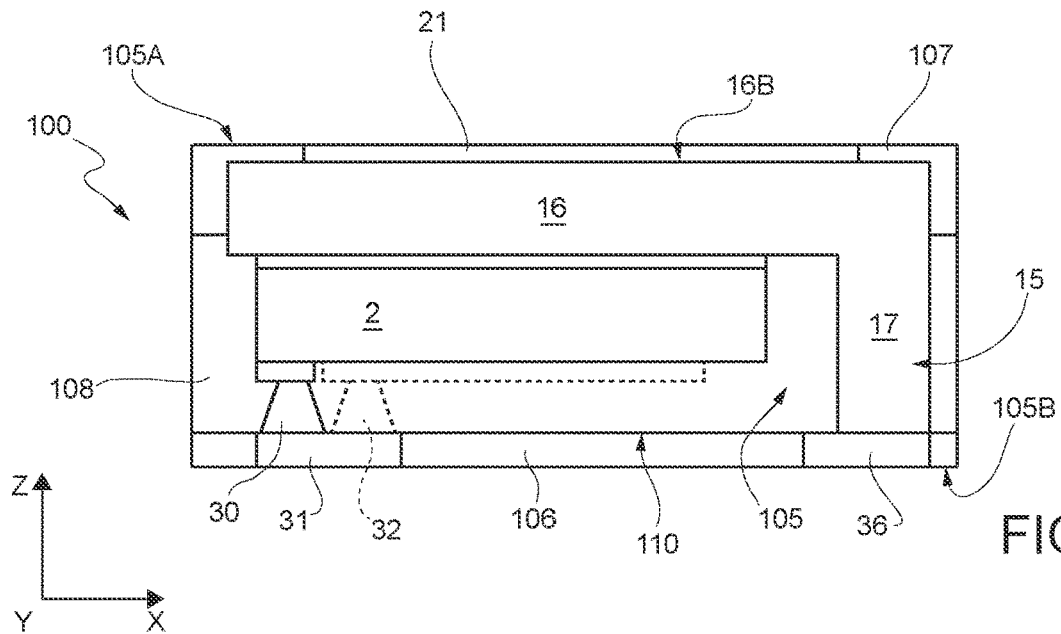
FIGS. 8-10 are respectively a cross-section, a perspective top view and a schematic bottom view similar to FIGS. 1-3, of a different embodiment of the present power semiconductor device, and relating to the first shape of the leadframe.
Figure 9:
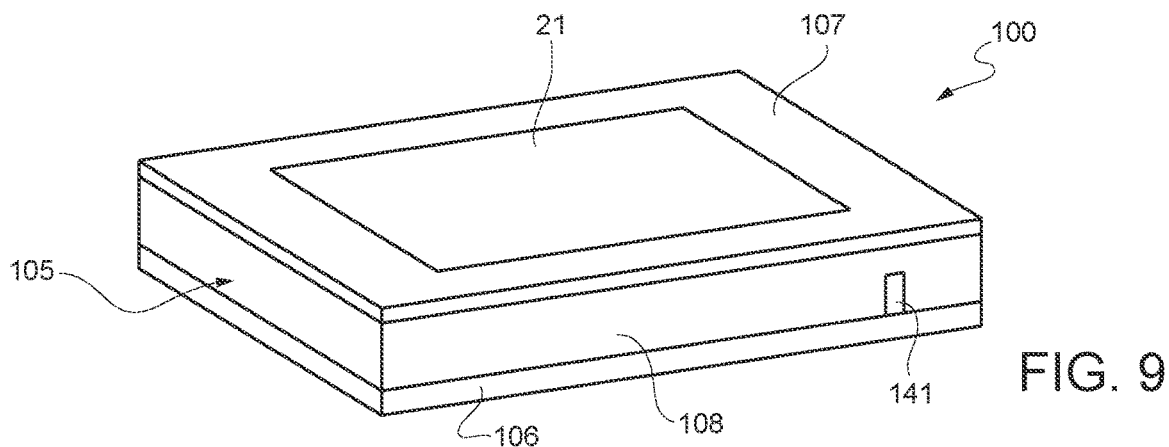
Figure 10:
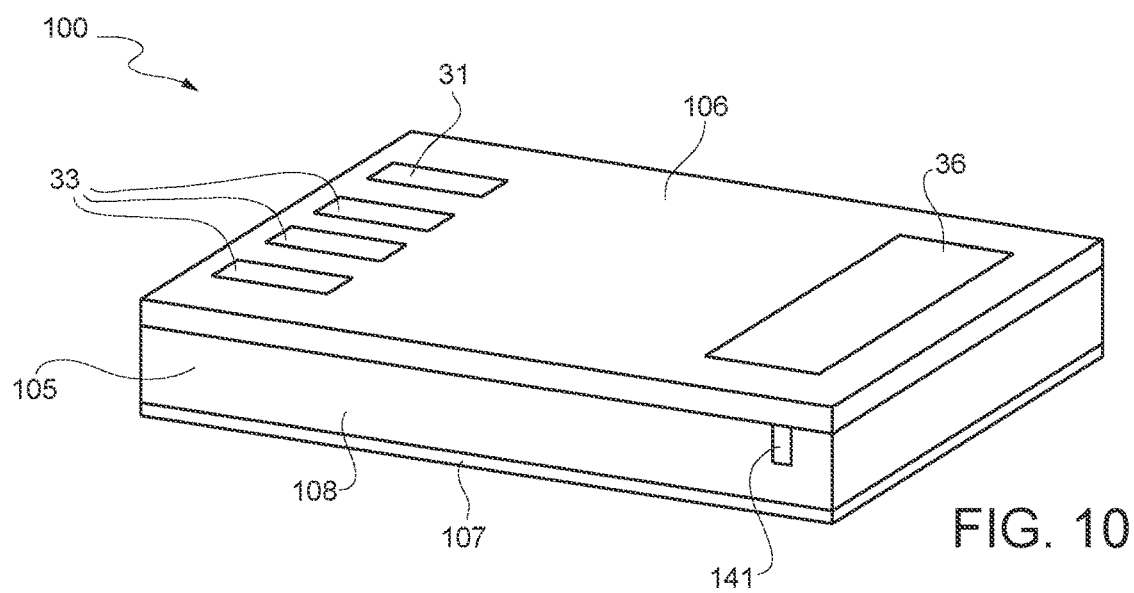

FIGS. 8-10 show a power MOSFET device 100 of Dual Side Cooling (DSC) type, with the same first leadframe type, with laminated package and without projecting leads (leadless solution). Therefore, the power device 100 has a general structure similar to that of the power device 1 of FIGS. 1-3, and will be described only with reference to the differences, using like reference numerals for like parts.

In detail, the power device 100 of FIGS. 8-10 is obtained through a lamination process (described hereinafter with reference to FIGS. 11A-11G, 12A-12G) which leads to forming a package 105 comprising a packaging region 108, a first insulating layer 106 and a second insulating layer 107. The package 105 has a first main surface 105A (arranged at the top in FIG. 8) and a second main surface 105B (arranged at the bottom in FIG. 8), similar to the surfaces 5A and 5B of the package 5 of FIG. 1.

The packaging region 108 here surrounds the die 2, the transverse section 17 and only the top portion (at the bottom in FIG. 8) of the base section 16, which may be referred to as a base arm, of the leadframe 15 and has a main surface 110 (in FIG. 8, at the bottom).

The gate connection region 30 and the source connection region 32 (in dashed lines in FIG. 8) are also embedded in the packaging region 108, but the drain 36, gate 31 and source leads 33 (FIG. 10) are formed in the first insulating layer 106 (e.g., an insulating solder) extending on the main surface 110 of the packaging region 108.

A second insulating layer 107 extends partially on the second side 16B of the base section 16 of the leadframe 15 and partially on the packaging region 108, where it laterally surrounds the front thermal dissipation region 21.

In FIGS. 8 and 9 connection arms 141 (similar to the connection arms 41 of FIG. 4) are also visible and deriving from cutting the leadframe 15, as discussed hereinafter.

The embodiment of FIGS. 8-10 is also characterized by high dissipation and large creepage distance D1 (FIG. 10) and is therefore suitable for high voltage applications.

The power device 100 of FIGS. 8-10 may be formed using manufacturing steps shown in FIGS. 11A-11G, 12A-12G, 13 and described hereinafter.

In particular, FIGS. 11A-11G, 12A-12G and 13 refer to the simultaneous manufacturing of several power devices 100 (e.g., an array of power devices) which are separated (e.g., singulated) in a final cutting step. In particular, FIGS. 11A-11G and 12A-12G show only one part of the overall structure, which is intended to form a single power device 100, while FIG. 13 shows the overall structure before cutting.

Specifically, FIG. 13 shows the overall structure for manufacturing four power devices 100 arranged side by side in the width direction, along the first axis X of the Cartesian reference system XYZ, but in general any number of power devices 100 may be formed at the same time, depending on the techniques and machines used.

In detail, FIGS. 11A, 12A show an intermediate structure obtained after bonding a die 2 (already provided with the drain 11, gate 12 and source contact regions 13) to the respective leadframe 15. The leadframe 15 is here part of a leadframe bar or string visible in FIG. 13 and having the shape shown in FIG. 4 and therefore still referred to as multiple support structure 40; unlike FIG. 4, however, the rear drain conductive regions 36 have not yet been formed in the manufacturing step of FIGS. 11A, 12A.

Returning to FIGS. 11A, 12A, the die 2 is bonded to its leadframe 15 with its drain contact region 11 arranged downwards, while the gate 12 and source contact regions 13 are arranged upwards.

Then, FIGS. 11B, 12B, the packaging region 108 is formed by laminating an insulating material, depositing and pressing successive sheets of material up to reaching the height of the transverse section 17 of the leadframes 15.

In FIGS. 11C, 12C, the packaging region 108 is holed from the main surface 110, for example by laser, to form gate holes 120 and source holes 121, intended to accommodate the gate 30 and source connection regions 32.

Then, FIGS. 11D, 12D, the gate holes 120 and the source holes 121 are filled, for example, by plating a conductive material, such as copper. In this step, in addition to forming the gate 30 and source connection regions 32, a conductive layer 125 is also formed and covers the main surface 110 of the packaging region 108.

Subsequently, FIGS. 11E, 12E, the conductive layer 125 is shaped through one or more etching steps; in particular, it is removed throughout the thickness to electrically separate the portions in contact with the gate connection regions 30 and with the source connection regions 32 as well as with the leadframe 15 from each other, furthermore it is reduced in thickness where the gate, source and drain leads 31, 33 and 36 are not intended to be formed.

Then, FIGS. 11F, 12F, the first insulating layer 106, for example a solder mask, is deposited above the conductive layer 125, separating the parts to be electrically insulated, and is then shaped to form openings 126 where the gate 30, source 33 and drain leads 36 are intended to be formed.

Furthermore, the second conductive layer 107 is deposited and shaped below the horizontal section 16 of the leadframe 15. In particular, the second conductive layer 107 forms a single large opening 127 which exposes most of the horizontal section 16 of the leadframe 15.

Then, FIGS. 11G and 12G, the leads 31, 33 and 36 and the front thermal dissipation region 21 are formed. To this end, for example, an ENIG (Electroless Nickel Immersion Gold) process is used, including a galvanic nickel growth and formation of a thin gold layer obtained by immersion, to improve soldability and non-oxidability.

In this manner, an intermediate structure 130 shown in FIG. 13 is obtained; the intermediate structure 130 is formed by a plurality of power devices 100 arranged side by side, bonded to the multiple support structure 40 (still undivided) and mutually connected by parts of the packaging region 108 and of the first and second insulating layers 106, 107 as well as by the connection arms 141.

After possible marking operations, not shown, the intermediate structure 130 is cut along cutting lines represented by arrows 135 in FIG. 13 to obtain the single power devices 100 of FIGS. 8-10.

Figure 14:
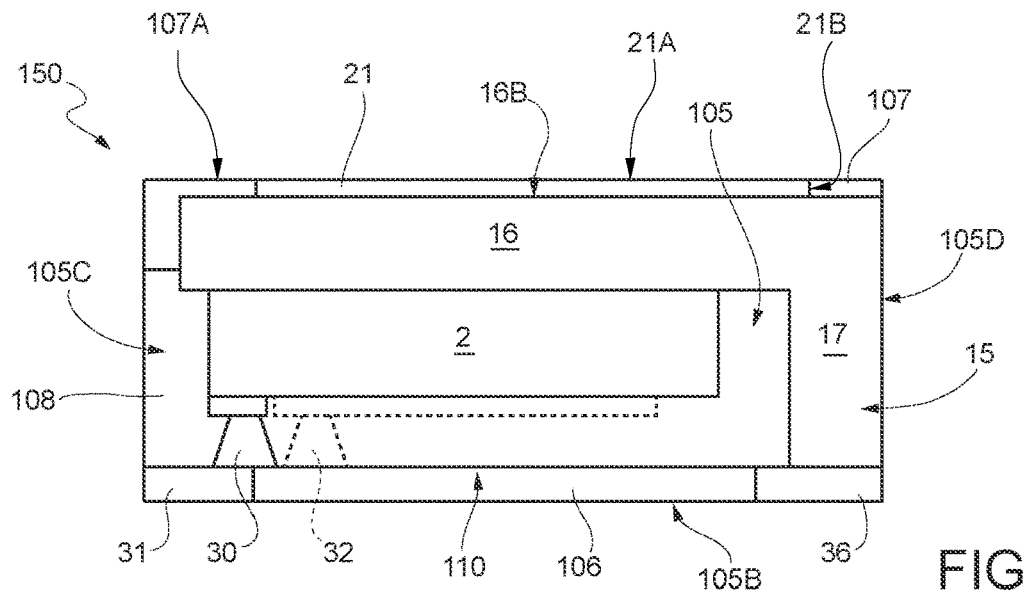
FIGS. 14-16 are respectively a cross-section, a perspective top view and a schematic bottom view of another embodiment of the present power device, and relating to the first shape of the leadframe.
Figure 15:
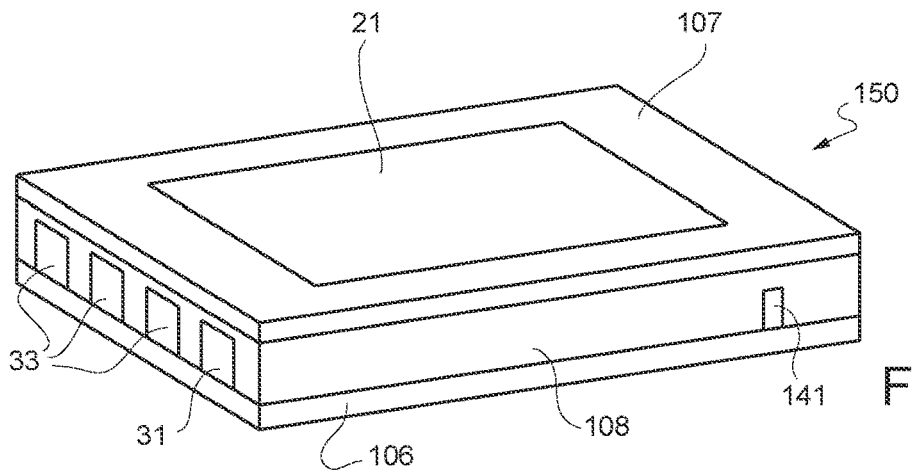
Figure 16:
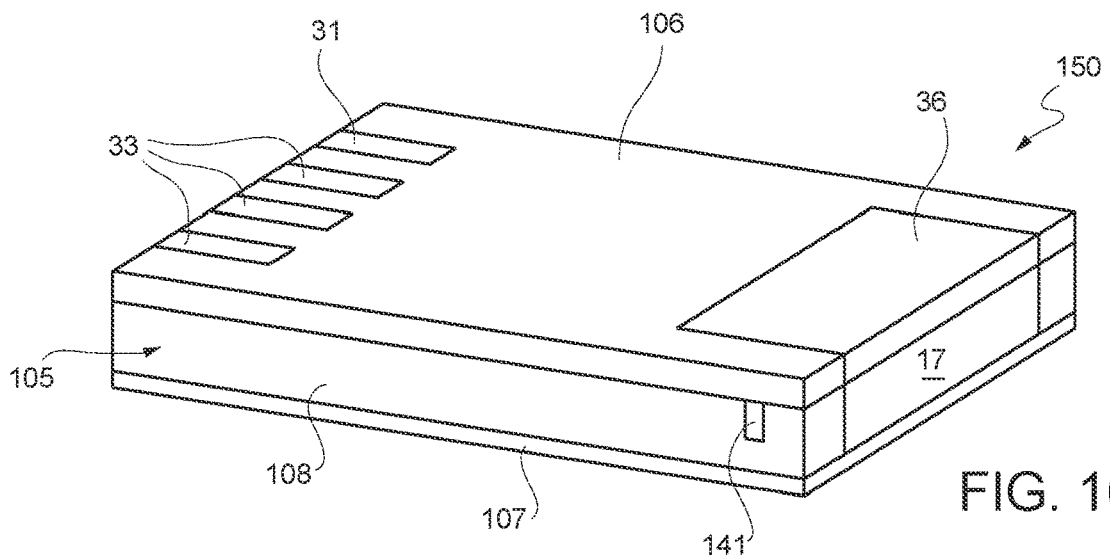

FIGS. 14-16 show a power device 150 of Dual Side Cooling (DSC) type, with the same first type of L-shaped leadframe, laminated package and projecting leads.

Therefore, the power device 150 has a general structure similar to the power device 100 of FIGS. 8-10, but gate and source leads 31, 33 (FIGS. 15, 16) as well as transverse section 17 of the leadframe 15 arranged similarly to what has been described with reference to FIGS. 5-7.

In particular, in FIGS. 14-16, the gate and source leads 31, 33 are arranged to face, in particular level with, a transverse wall, herein referred to as the first transverse wall 105C, by analogy to the power device 1 of FIG. 1, and the transverse section 17 of the leadframe 15 is arranged to face, in particular level with, an opposite transverse wall, herein referred to as the second transverse wall 105D.

This solution is also characterized by a large creepage distance D1 and is particularly suitable for automotive applications and where it is desired to have leads extending also on side walls (such as the first and the second transverse walls 105C, 105D) for obtain an increase in the solder area and/or a better inspectability of the solder to a support, for example a printed circuit board, such as the support 3 shown in FIG. 1.

The power device 150 of FIGS. 14-16 may be formed using the same manufacturing process described above with reference to FIGS. 11A-11G, 12A-12G, 13, through suitable sizing and arrangement of the different regions and/or by providing suitable steps for forming transverse parts of the gate and source leads 31, 33 and of the transverse section 17 of the leadframe 15.

As shown in FIG. 14, the surface 21A of the front thermal dissipation region 21 is substantially coplanar with a surface 107A of the second insulating material 107. The sidewalls 21B of the front thermal dissipation region 21 are covered by the second insulating material 107.

Figure 17:
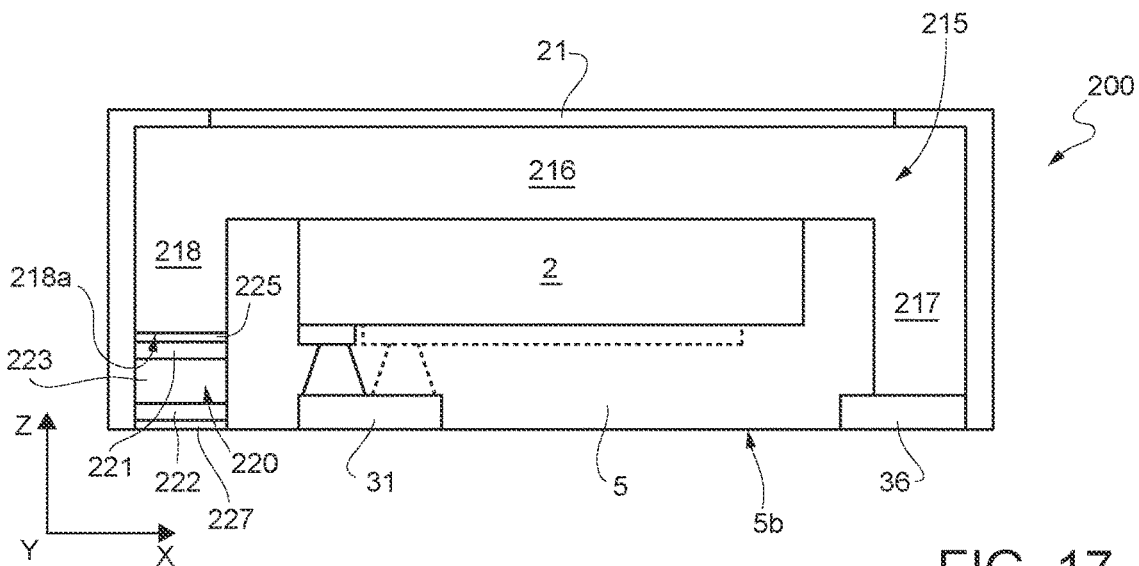
FIGS. 17-19 are respectively a cross-section, a perspective top view and a schematic bottom view of yet another embodiment of the present power device, and relating to a second shape of the leadframe.
Figure 18:
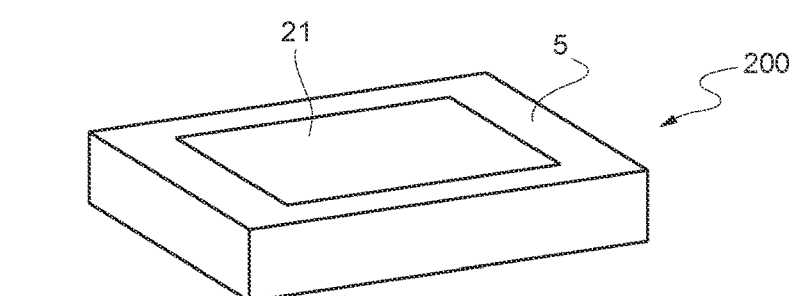
Figure 19:
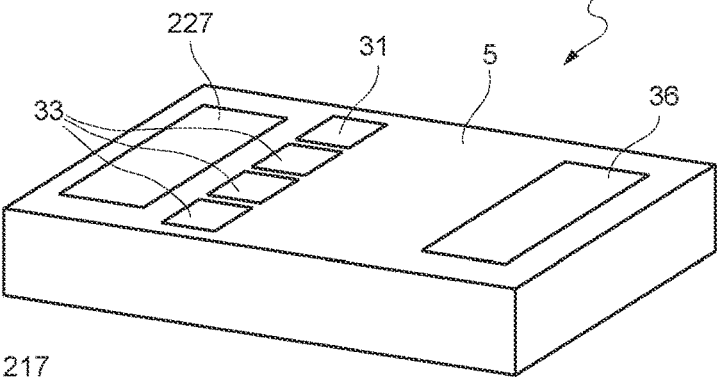

FIGS. 17-19 show a power device 200 of Dual Side Cooling (DSC) type, with a second leadframe type, with molded package and without projecting leads (leadless solution).

The power device 200 has a structure similar to the power device 1 of FIGS. 1-3, and will be described only with reference to the differences, using like reference numerals for like parts.

In detail, in FIGS. 17-19, the leadframe, here indicated by 215, has the shape of an inverted C in the section plane of FIG. 17, due to the presence of a second transverse section 218, in addition to the transverse section 17 (hereinafter referred to as the first transverse section 217) already present in the leadframe 15 of FIGS. 1-16 (see also FIG. 20).

Figure 20:
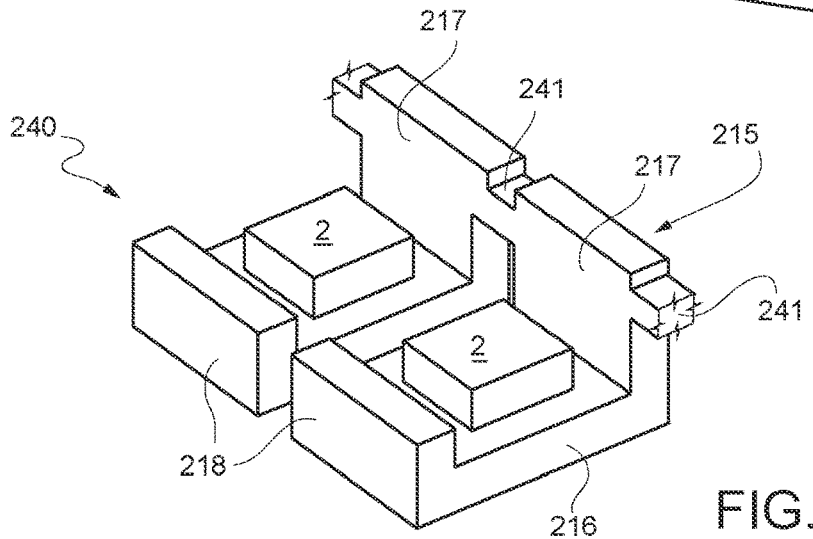
FIG. 20 is a perspective top view of a portion of another multiple support structure used for a plurality of power devices, for example of the type shown in FIGS. 17-19, in an intermediate manufacturing step.

The second transverse section 218 extends from an edge of the base section (here indicated by 216) opposite (in the length direction parallel to the first axis X) to the edge of the first transverse section 217 to extend adjacent to and at a distance from the die 2, on the opposite side with respect to the first transverse section 217, as also visible in FIG. 20, which shows a plurality of leadframes 215, not yet divided.

The second transverse section 218 has a lesser height with respect to the first transverse section 217, for example approximately equal to the die 2. The second transverse section 218 has an end surface 218A here approximately level with the die 2. However, this alignment is not essential and the second transverse section 218 might be a little higher or lower than the die 2 in the height direction of the power device 200 (along third axis Z).

A thermal connection structure 220 extends between the end surface 218A of the second transverse section 218 and the second main surface 5B of the package 5. The thermal connection structure 220 is electrically insulating, but thermally conductive, to create a third thermal dissipation path from the die 2 to the second main surface 5B of the package 5, in addition to the thermal dissipation path towards the front side of the power device 200, through the front thermal dissipation region 21 (first thermal dissipation path), and to the thermal dissipation path towards the rear side of the power device 200, through the first transverse section 217 of the leadframe 215 and the drain lead 36 (second thermal dissipation path).

The thermal connection structure 220 may be formed, for example, by a DBC (Direct Bonded Copper) multilayer comprising a first and a second metal layer 221, 222 and an intermediate insulating layer 223, for example of ceramic such as alumina ($Al_2O_3$), aluminum nitride (AlN) or beryllium oxide (BeO).

In the example shown, the thermal connection structure 220 is bonded to the end surface 218A of the second transverse section 218 through an adhesive layer 225; a thermal continuity region 227 extends between the thermal connection structure 220 and the second main surface 5B of the package 5, facing, in particular level with, the second main surface 5B, to favor soldering with a carrying substrate, for example the support 3 of FIG. 1. The thermal continuity region 227 further completes the third thermal dissipation path towards the second main surface 5B of the package 5.

In the example shown, the thermal continuity region 227 may be formed like the gate 31, source 33 and drain leads 36, for simplicity of manufacture, even if it has no electrical function.

The power device 200 of FIGS. 17-20 is characterized by a high thermal dissipation capacity, due to the three thermal dissipation paths, a large creepage distance (given here again by the distance D1 between the source leads 33 and the drain lead 36). In particular, here, the second transverse section 218 of the leadframe 215, having a lesser height with respect to the first transverse section 217, terminates at a distance from the gate 31 and source leads 33.

The power device 200 of FIGS. 17-20 may be formed similarly to what described for the power device 1 of FIGS. 1-3, using the multiple support structure 240 of FIG. 20. In detail, in FIG. 20, multiple structure support 240 forms a monodirectional string of leadframes 215, having dice 2 already bonded thereto, prior to molding the package 5 and cutting into single power devices 200.

In particular, in the multiple support structure 240 of FIG. 20, the leadframes 215 are arranged side by side and mutually connected by connection arms 241 which connect pairs of adjacent leadframes 215 at the transverse section 217 thereof.

In a not-shown manner, similarly to FIG. 4, the drain leads 36 and the front thermal dissipation regions 21 may already be bonded on the multiple support structure 240. Furthermore, here, in a not-shown manner, the thermal connection structures 220 of the different power devices 200 may already be bonded on the multiple support structure 240.

Also for the power device 200 of FIGS. 17-19, the multiple support structure 240 with the mounted dice 2 may be cut prior to molding the package 5 or subsequently.

Figure 21:
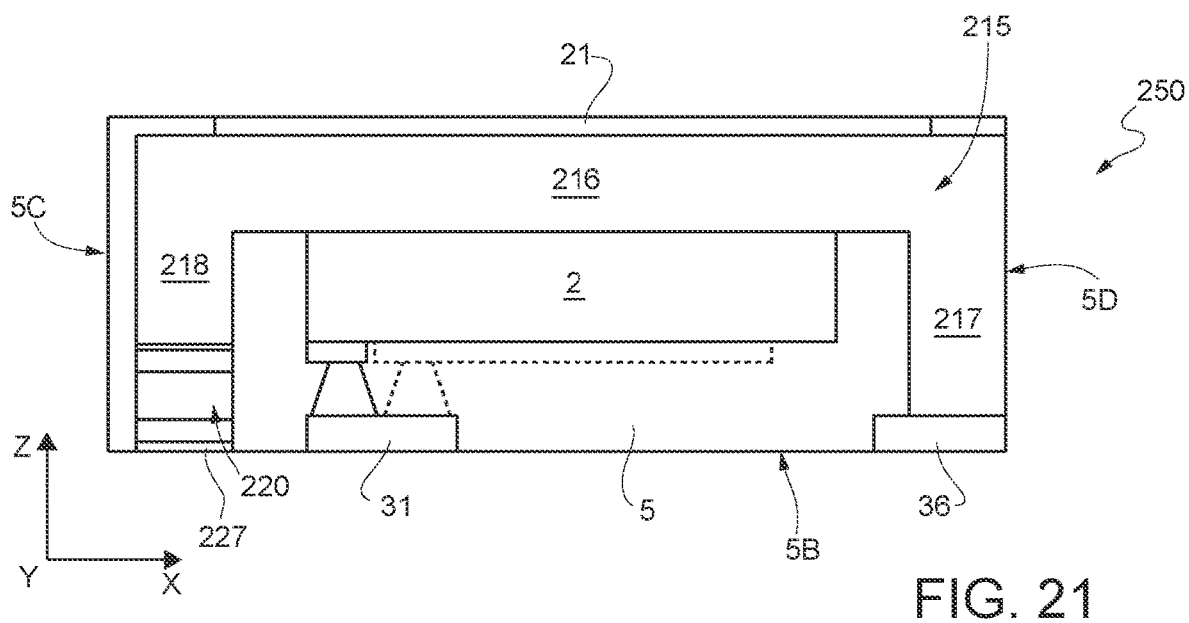
FIGS. 21-23 are respectively a cross-section, a perspective top view and a schematic bottom view of a further embodiment of the present power device, and relating to the second shape of the leadframe.
Figure 22:
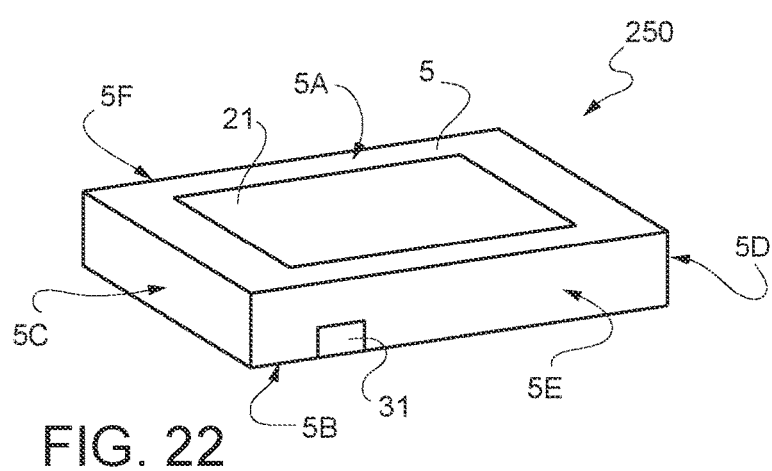
Figure 23:
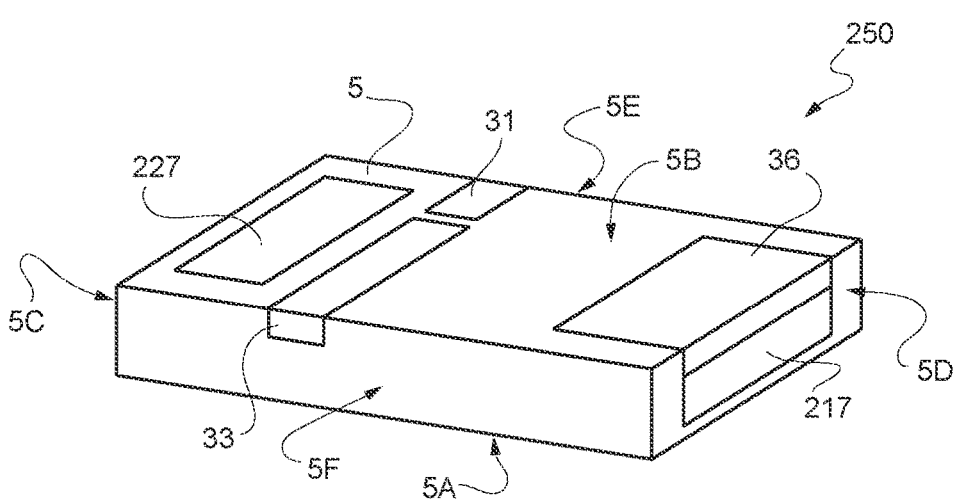

FIGS. 21-23 show a power device 250 of Dual Side Cooling (DSC) type, having the second type of inverted C-shaped leadframe (similar to the leadframe 215), molded package and projecting leads. Therefore, the power device 250 has a structure similar to that of the power device 200 of FIGS. 17-19, but the source, gate and drain leads face the side walls of the package 5, similarly to the power device 50 of FIGS. 5-7.

In this case, as visible in particular in FIGS. 22, 23, unlike the power device 50 of FIGS. 5-7 and the power device 150 of FIGS. 14-16, the gate leads 31 face the first longitudinal wall 5E and the source leads 33 face the second longitudinal wall 5F.

Furthermore, here again the transverse section 217 of the leadframe 215 is arranged level with the second transverse wall 5D.

In the embodiment shown, furthermore, instead of three distinct source leads 33, only one is provided.

The solution of FIGS. 21-23 is also characterized by a large creepage distance D1 and high thermal dissipation; it is also particularly suitable for automotive applications, as discussed hereinabove.

Figure 24:
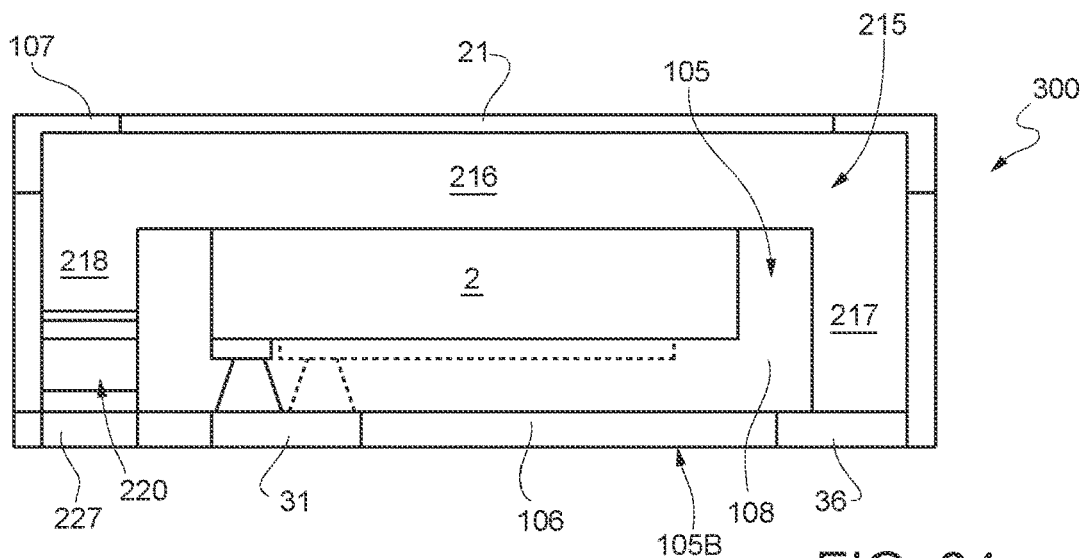
FIGS. 24-26 are respectively a cross-section, a perspective top view and a schematic bottom view of another embodiment of the present power device, relating to the second shape of the leadframe.
Figure 25:
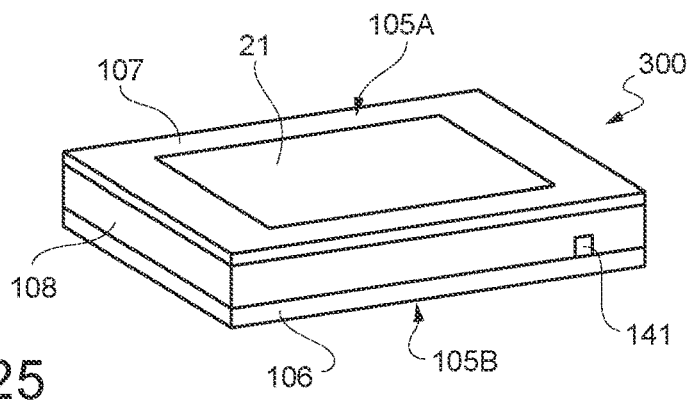
Figure 26:
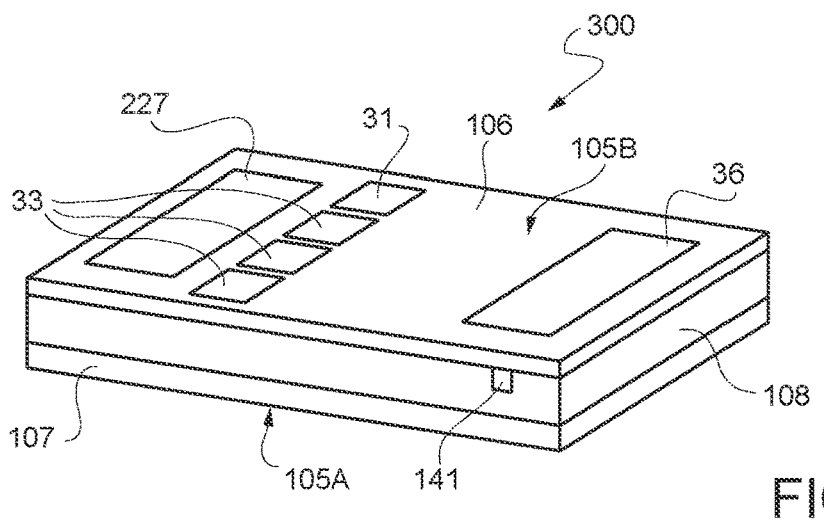

FIGS. 24-26 show a power device 300 of Dual Side Cooling (DSC) type, having the second type of inverted C-shaped leadframe (leadframe 215), laminated package and without projecting leads (leadless solution).

The power device 300 has a general structure similar to the power device 200 of FIGS. 17-19, but is obtained through a lamination process similar to the one previously described with reference to FIGS. 11A-11G, 12A-12G and 13.

The power device 300 is then enclosed in a package 105 of laminated type, has the thermal connection structure 220 with the bonding region 227 extending thereon, and has gate 31 and source terminals 33 facing only the second main surface 105B of the package 105.

The solution of FIGS. 24-26 is also characterized by a large creepage distance D1 and high thermal dissipation.

Figure 27:
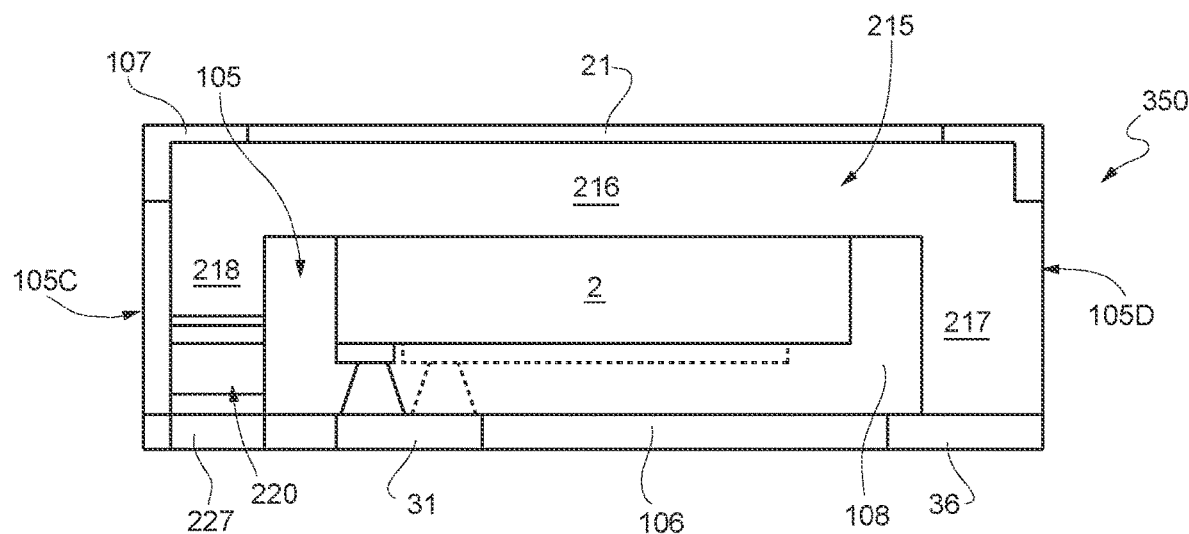
FIGS. 27-29 are respectively a cross-section, a perspective top view and a schematic bottom view of a further embodiment of the present power device, relating to the second shape of the leadframe.
Figure 28:
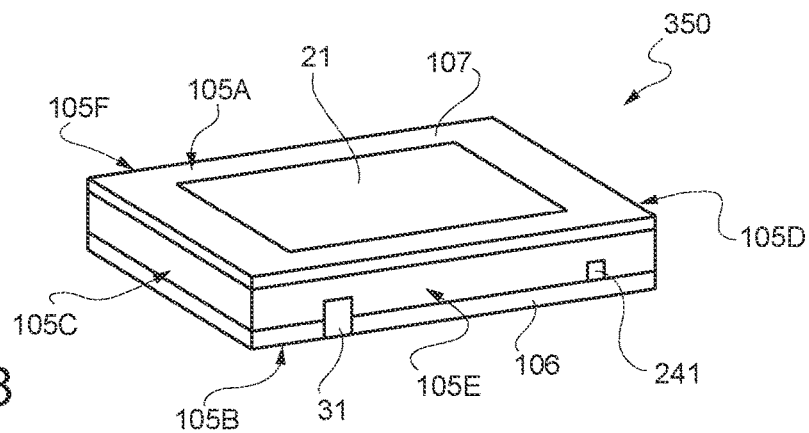
Figure 29:
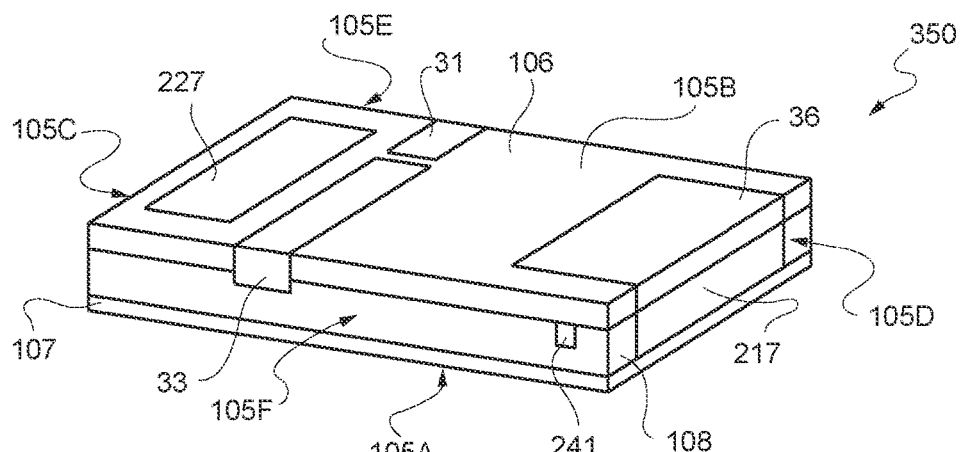

FIGS. 27-29 show a power device 350 of Dual Side Cooling (DSC) type, with the second type of inverted C-shaped leadframe (leadframe 215), laminated package and with projecting leads.

Therefore, the power device 350 has a general structure similar to the power device 300 of FIGS. 24-26, but the gate and source leads 31, 33 (FIGS. 28, 29) as well as the first transverse section 217 of the leadframe 215 face the side walls of the package 105, similarly to what described with reference to FIGS. 21-23. In this embodiment, the second transverse section 218 may also face the first transverse wall 105C, if the distance of its lower exposed edge, calculated along the side profile of the package 105, from the gate and source leads 31, 33 is larger than or equal to the creepage distance D1 (FIG. 29).

In particular, here the gate and source leads 31, 33 face a respective side wall; specifically, the gate lead 31 is arranged level with the first longitudinal wall, here indicated by 105E (FIG. 28), and the source lead 33 (here only one) is arranged level with the second longitudinal wall, here indicated by 105F (FIG. 29). Furthermore, the first transverse section 217 of the leadframe 215 is arranged level with the second transverse wall 105D.

The solution of FIGS. 27-29 is also characterized by a large creepage distance D1 and high thermal dissipation; it is also particularly suitable for automotive applications, as discussed hereinabove.

Figure 30:
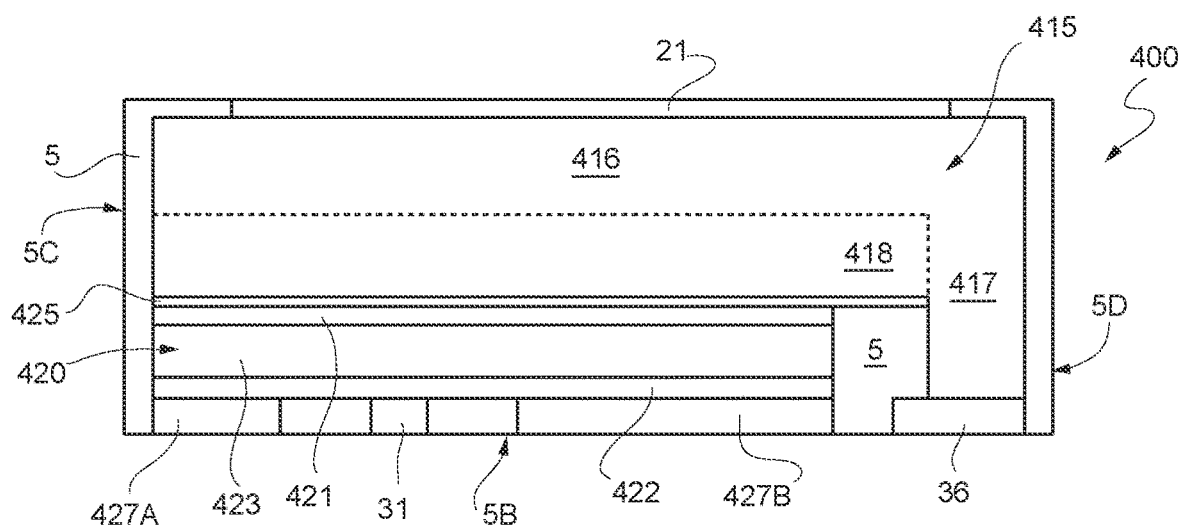
FIGS. 30-32 are respectively a cross-section taken along section line XXX-XXX of FIG. 31, a perspective top view and a schematic bottom view of yet another embodiment of the present power device, and relating to a third shape of the leadframe.
Figure 31:
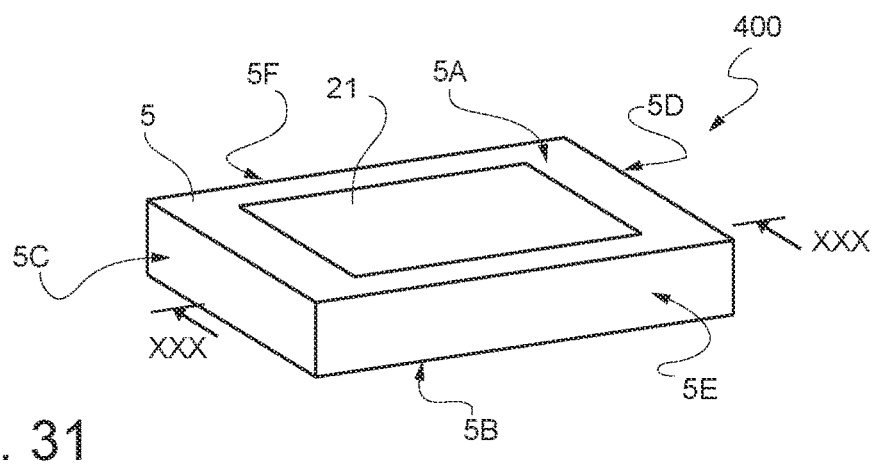
Figure 32:
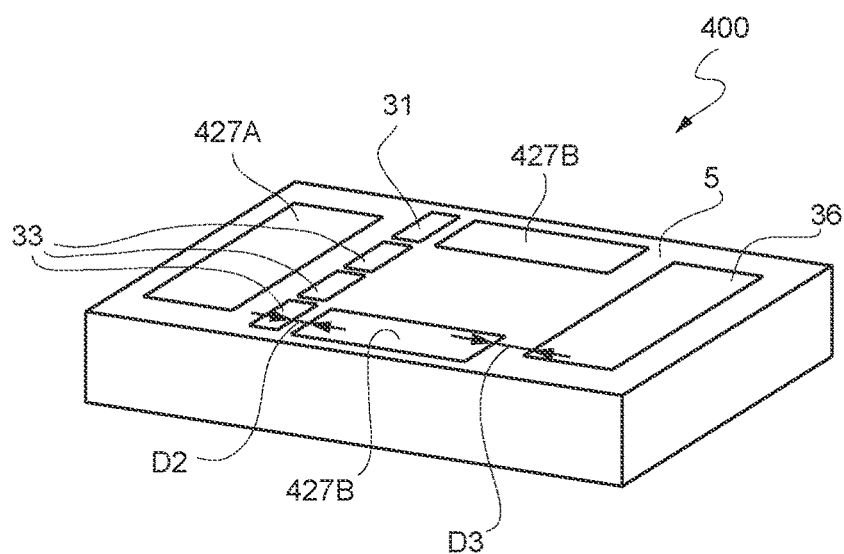
Figure 34:
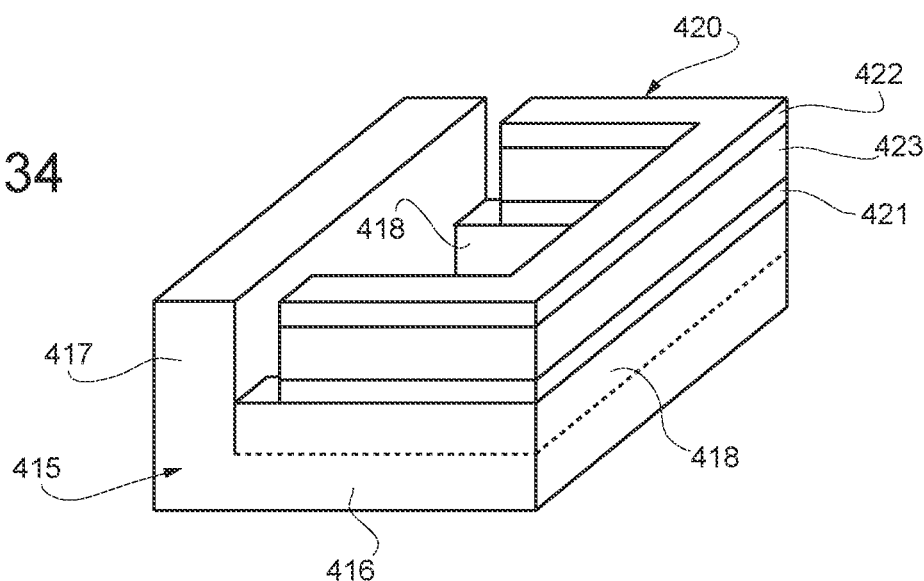
Figure 35:
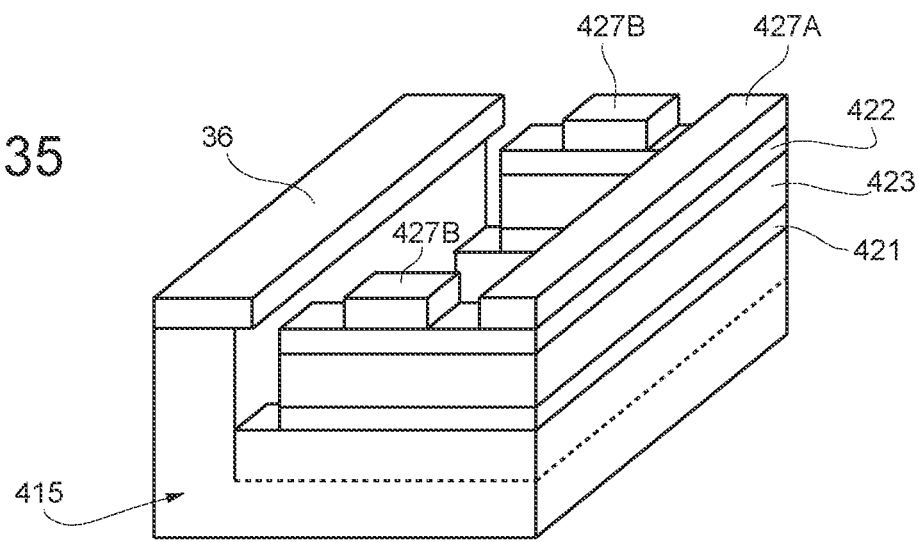

FIGS. 30-32 refer to a power device 400 of Dual Side Cooling (DSC) type, with a third type of leadframe (see also FIGS. 33-35), with molded package and without projecting leads (leadless solution).

The power device 400 has a general structure similar to the power device 1 of FIGS. 1-3, and will be described only with reference to the differences, using like reference numerals for like parts.

Figure 33:
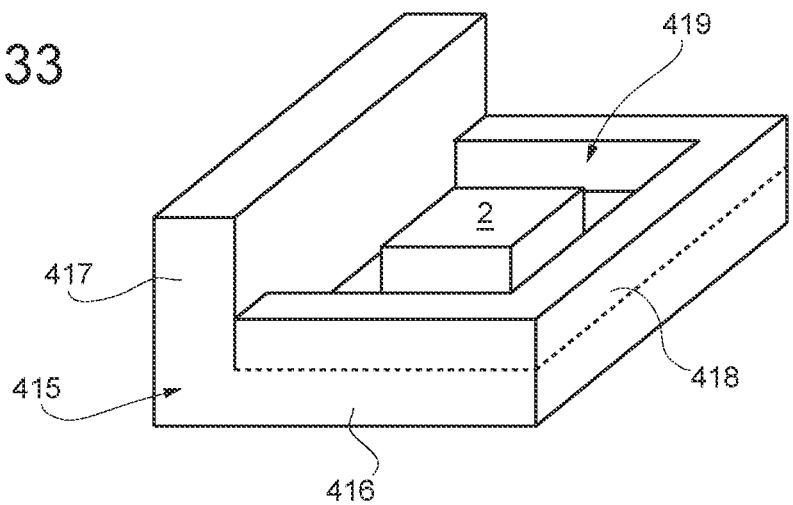
FIGS. 33-35 are perspective top views of the leadframe used in the power device of FIGS. 30-32, in successive manufacturing steps.

In detail, see in particular FIG. 33, in the power device 400, the leadframe, here indicated by 415, has the shape of an inverted cup o C-shape with a projecting wall; in practice, with respect to the first embodiment (leadframe 15, used in power devices 1, 50, 100 and 150), here the leadframe 415 has a delimitation wall 418, which extends to form a C (in plan view) from the base section, here indicated by 416, and runs along three sides of the rectangular shape of the base section 416. Here, the delimitation wall 418 connects with its ends to the transverse section (here indicated by 417). In practice, together with the transverse section 417, the delimitation wall 418 defines a recess 419 (FIG. 33) accommodating the die 2 therein.

Alternatively to the above, the delimitation wall 418 may have ends arranged in proximity to the transverse section 417, without contacting it directly.

The delimitation wall 418 has a smaller height than the transverse section 417, for example equal to the height of the die 2, even if it might be different.

A thermal connection structure 420, thermally conductive but electrically insulating, extends (with reference to FIG. 34) along and in contact with the delimitation wall 418. The thermal connection structure 420 has a structure similar to the thermal connection structure 220 and may be formed here again by a DBC (Direct Bonded Copper) multilayer comprising (FIG. 30) a first and a second metal layer 421, 422 and an intermediate insulating layer 423.

The thermal connection structure 420 has a C-shape of similar to the delimitation wall 418 (FIGS. 34, 35), but shorter arms, to extend at a distance from the transverse section 417 and thus be electrically connected to the leadframe 415 only with its first metal layer 421 (FIG. 30). Alternatively, the thermal connection structure 420 may be formed by disconnected portions.

Similarly to the embodiment of FIGS. 17-19, the thermal connection structure 420 may be bonded to the delimitation wall 418 through an adhesive layer 427.

Thermal continuity regions 427A-427B extend in contact with the thermal connection structure 420 (FIG. 35) and may be formed like the rear thermal dissipation region 36 and the gate 31 and source leads 33.

In the embodiment shown (see in particular FIG. 32) three thermal continuity regions 427A-427B are provided, one for each side of the C-shape of the thermal connection structure 420. In particular, a first thermal continuity region 427A is arranged on the side of the thermal connection structure 420 farther from the transverse section 417 of the leadframe 415 and is similar to the thermal continuity region 227 of FIGS. 21-23. Two second thermal continuity regions 427B are arranged on the arms of the C-shape of the thermal connection structure 420 which extend longitudinally (in parallel to the first axis X), are directed toward the transverse section 417 and are spaced from the first thermal continuity region 427A so that the gate 31 and source leads 33 may extend in the area between the first thermal continuity region 427A and the second thermal continuity regions 427B (FIGS. 30, 32).

The power device 400 may be generally made as previously described for the power device 200 of FIGS. 17-19. In particular, see also FIGS. 33 and 34, the thermal connection structure 420 may be bonded to the leadframe 415 when the leadframe 415 is still connected to adjacent leadframes 415 (not shown in FIGS. 33-35, but possibly arranged side by side, similarly to what described with reference to FIG. 20). Similarly, FIG. 35, the thermal continuity regions 427A-427B may be bonded to the thermal connection structure 420, prior to cutting the multiple support structure (similar to the homonymous structure 240 of FIG. 20) and molding the package 5. Alternatively, the thermal connection structure 420 and the thermal continuity regions 427A-427B may be bonded to the leadframe 417 after cutting the multiple support structure and prior to molding the package 5.

In the power device 400, the creepage distance is given by the distance D2 between the second thermal continuity regions 427B and the source leads 33 and by the distance D3 between second thermal continuity regions 427B and the drain lead 36.

Accordingly, the power device 400 is characterized by a very high thermal dissipation capacity, due to two further thermal dissipation paths in proximity to the longitudinal walls 5E, 5F, and formed by the arms of the C-shape of the thermal connection structure 420 and by the second thermal continuity regions 427B. Due to the shorter creepage distances, the power device 400 is suitable for low voltage applications (e.g., up to 300V), depending on the overall size of the package and the sum of the distances D2 and D3.

Figure 36:
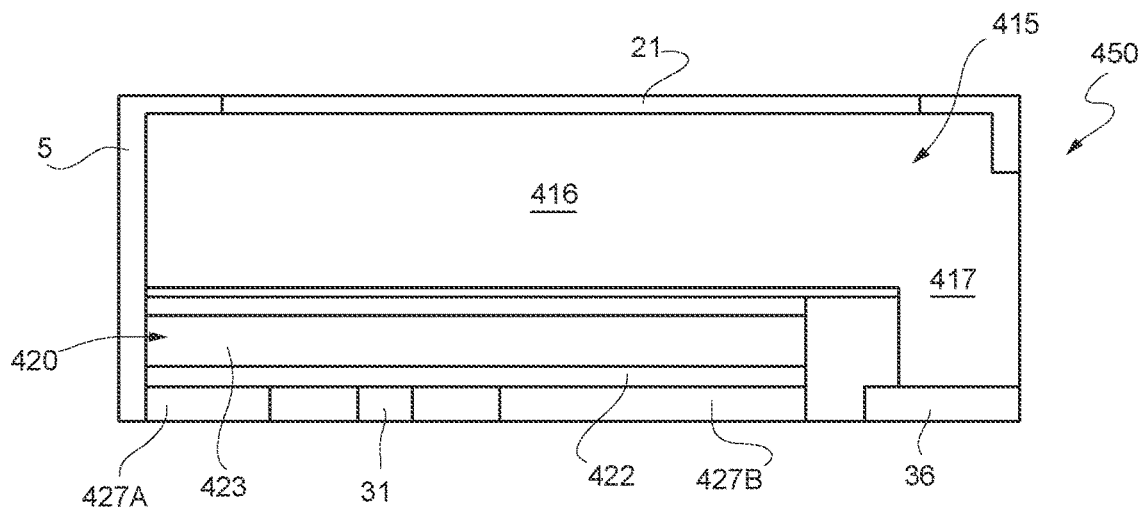
FIGS. 36-38 are respectively a cross-section (similar to the cross-section of FIG. 30), a perspective top view and a schematic bottom view of a different embodiment of the present power device, relating to the third shape of the leadframe.
Figure 37:
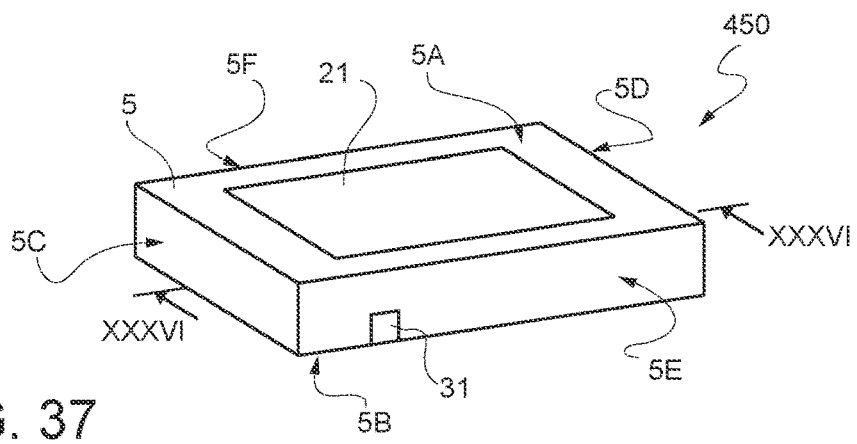
Figure 38:
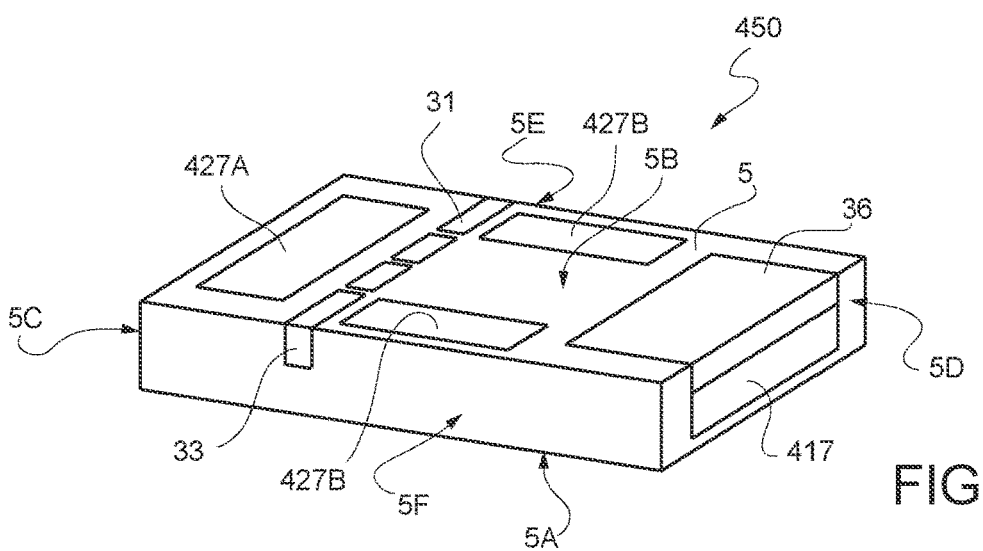

FIGS. 36-38 show a power device 450 of Dual Side Cooling (DSC) type, having the third type of inverted cup-shaped leadframe (leadframe 415), molded package and projecting leads. Therefore, the power device 450 has a structure similar to the power device 400 of FIGS. 30-32, but the source and gate leads 31, 33 face the longitudinal walls 5E, 5F of the package 5 and the drain lead 36 faces the second transverse wall 5D, similarly to the power device 250 of FIGS. 21-23.

Also in this case, as visible in particular in FIGS. 37, 38, the gate leads 31 are arranged side by side, in particular level with the first longitudinal wall 5E, and the source leads 33 are arranged side by side, in particular level with the second longitudinal wall 5F.

Furthermore, here again the transverse section 417 of the leadframe 415 is arranged side by side, in particular level with, the second transverse wall 5D.

In the embodiment shown, furthermore, three distinct source leads 33 are provided, one of which faces the second longitudinal wall 5F.

The solution of FIGS. 36-38 is also characterized by a very high thermal dissipation capacity; it is also particularly suitable for automotive applications and for low voltage applications, as discussed hereinabove.

Figure 39:
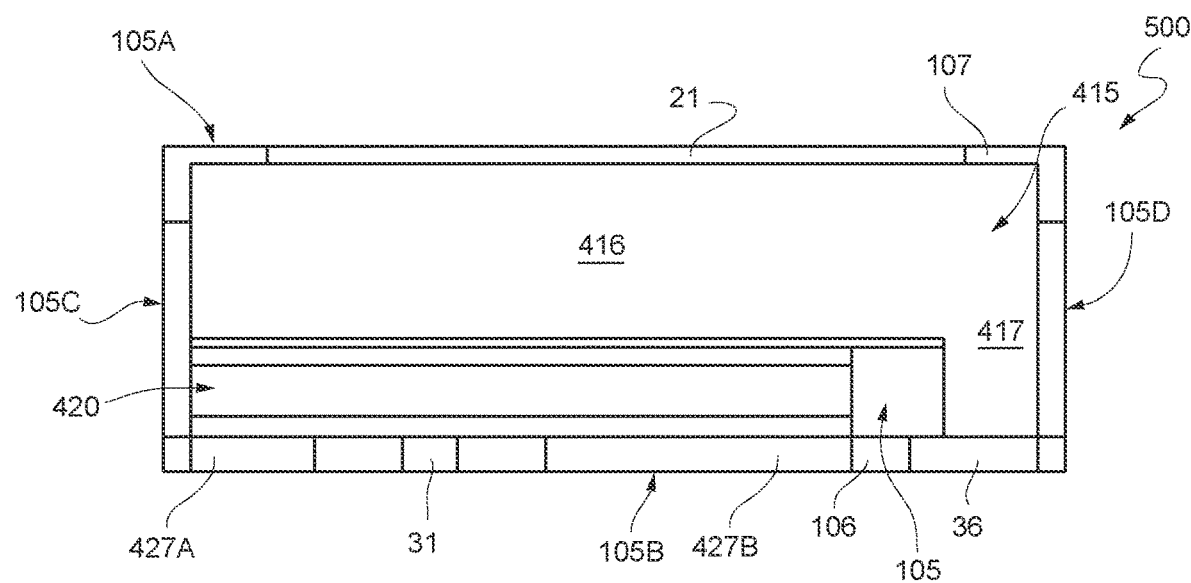
FIGS. 39-41 are respectively a cross-section (similar to the cross-section of FIG. 30), a perspective top view and a schematic bottom view of a further embodiment of the present power device, relating to the third shape of the leadframe.
Figure 40:
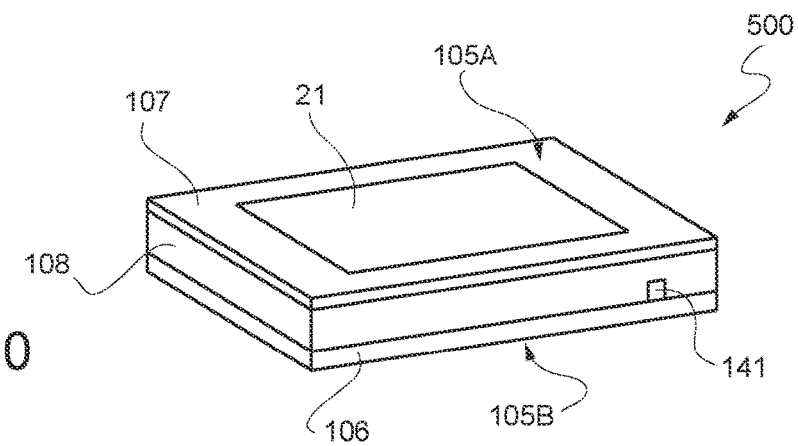
Figure 41:
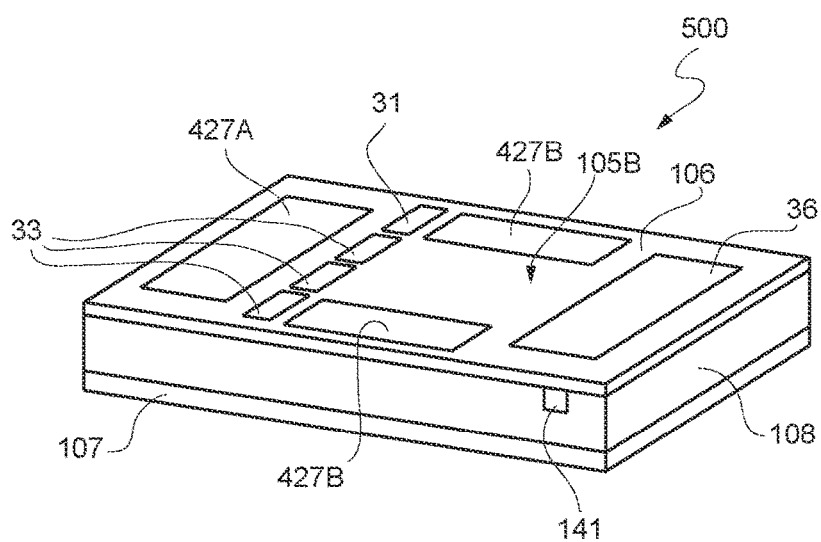

FIGS. 39-41 show a power device 500 of Dual Side Cooling (DSC) type, having the third type of inverted cup-shaped leadframe (leadframe 415), laminated package and without projecting leads (leadless solution).

The power device 500 has a general structure similar to the power device 400 of FIGS. 30-32, but is obtained through a lamination process similar to the one previously described with reference to FIGS. 11A-11G, 12A-12G and 13.

The power device 500 is then enclosed in a package 105 of laminated type, has the thermal connection structure 420 thermally coupled to the thermal continuity regions 427A-427B and has gate and source terminals 31, 33 facing only the second main surface 105B of the package 105 (FIG. 41).

The solution of FIGS. 39-41 is also characterized by a very high thermal dissipation.

Figure 42:
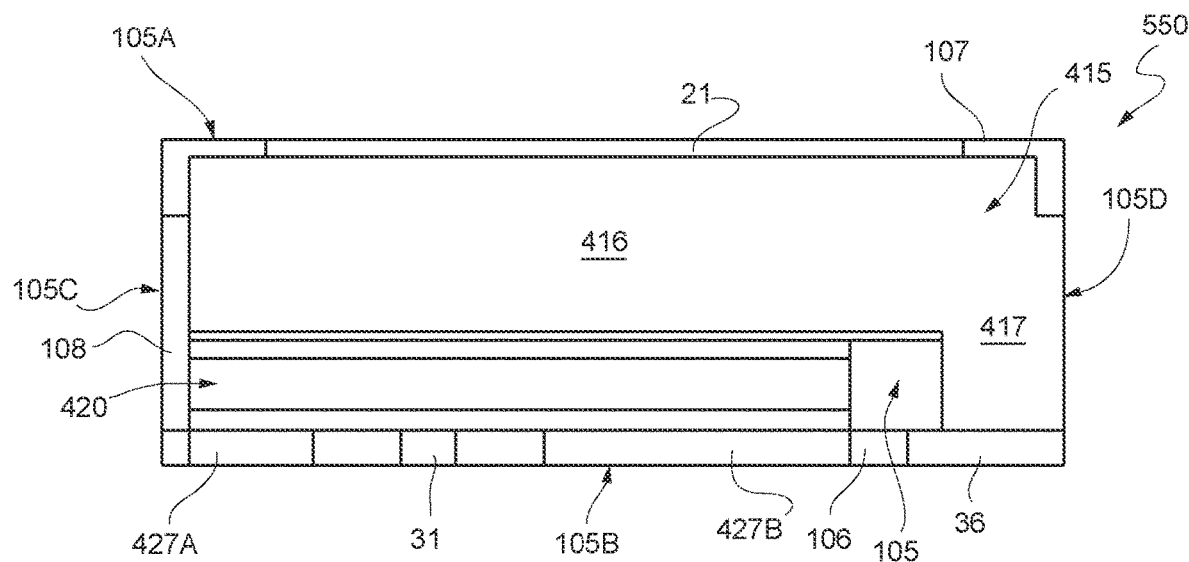
FIGS. 42-44 are respectively a cross-section (similar to the cross-section of FIG. 30), a perspective top view and a schematic bottom view of yet another embodiment of the present power device, relating to the third shape of the leadframe.
Figure 43:
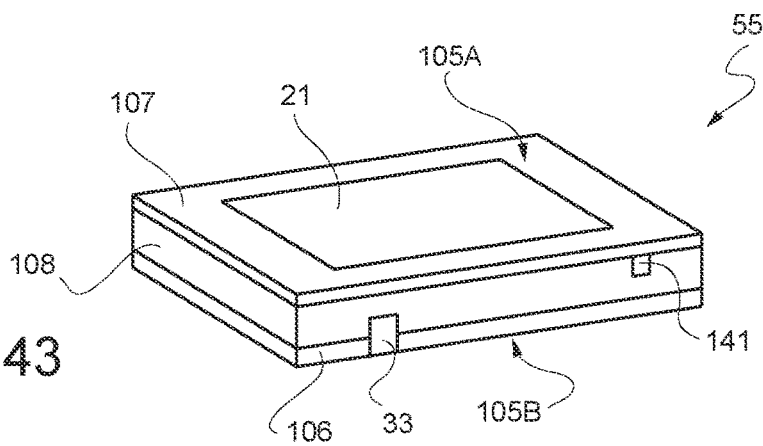
Figure 44:
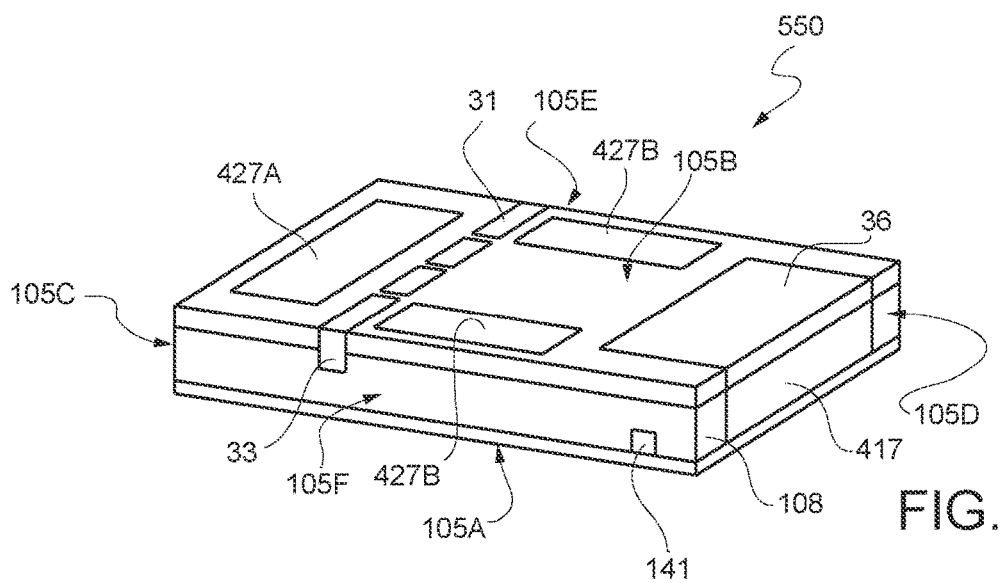

FIGS. 42-44 show a power device 550 of Dual Side Cooling (DSC) type, with the third type of inverted cup-shaped leadframe (leadframe 415), laminated package and with projecting leads.

Therefore, the power device 550 has a general structure similar to the power device 500 of FIGS. 39-41, but the gate and source leads 31, 33 (FIGS. 43, 44) as well as the transverse section 417 of the leadframe 415 face the side walls of the package 105, similarly to what described with reference to FIGS. 36-38.

In particular, here the gate lead 31 is arranged side by side with the first longitudinal wall 105E, one of the source leads 33 is arranged at a side of the second longitudinal wall 105F and the transverse section 417 of the leadframe 415 is arranged at a side of the second transverse wall 105D.

The solution of FIGS. 42-44 is also characterized by a very high thermal dissipation; it is also particularly suitable for automotive applications, as discussed hereinabove.

Figure 45:
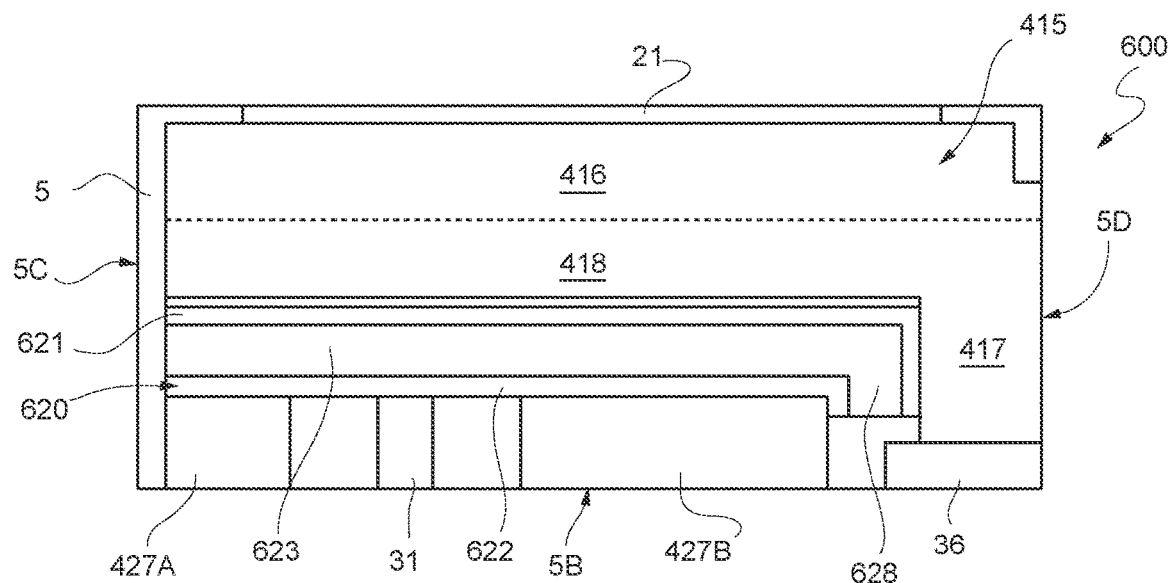
FIG. 45 is a cross-section (similar to the cross-section of FIG. 30) of a different embodiment of the present power device, relating to the third shape of the leadframe.

FIG. 45 shows a variation of the power device 400 of FIGS. 30-32, wherein the thermal connection structure, here indicated by 620, has a transverse portion 628 to improve the electrical insulation of the thermal connection structure 620 from the transverse section 417 of the leadframe 415.

In practice, the transverse portion 628 extends from the longitudinal end, close to the transverse section 417, of the thermal connection structure 620 in direction of the second main surface 5B of the package 5, so that the second metal layer (here indicated by 622) no longer faces the transverse section 417 of the leadframe 415, but its end faces the second main surface 5B of the package 5 (as well as the corresponding ends of the first metal layer and of the intermediate insulating layer, here indicated by 621 and 623, respectively). In this manner, the transverse section 417 of the leadframe 415 may be electrically separated, in a safe way, from the second metal layer 622 and from the second thermal continuity regions 427B.

This variation is also applicable to the power devices 450, 500 and 550 having the cup-shaped leadframe 415.

Furthermore, in FIG. 45, the height of the thermal connection structure 620 is chosen so that the height (with respect to the base section 426) of the surface of the thermal connection structure 620 facing the second main surface 5B of the package 5 (including the delimitation wall 418 of the leadframe 415) is lower than the height of the transverse section 417. In this case, the thermal continuity regions 427A-427B have greater thickness with respect to the power devices 400, 450, 500 and 550.

This variation is also applicable also to power devices 450, 500 and 550 having the cup-shaped leadframe 415.

Figure 46:
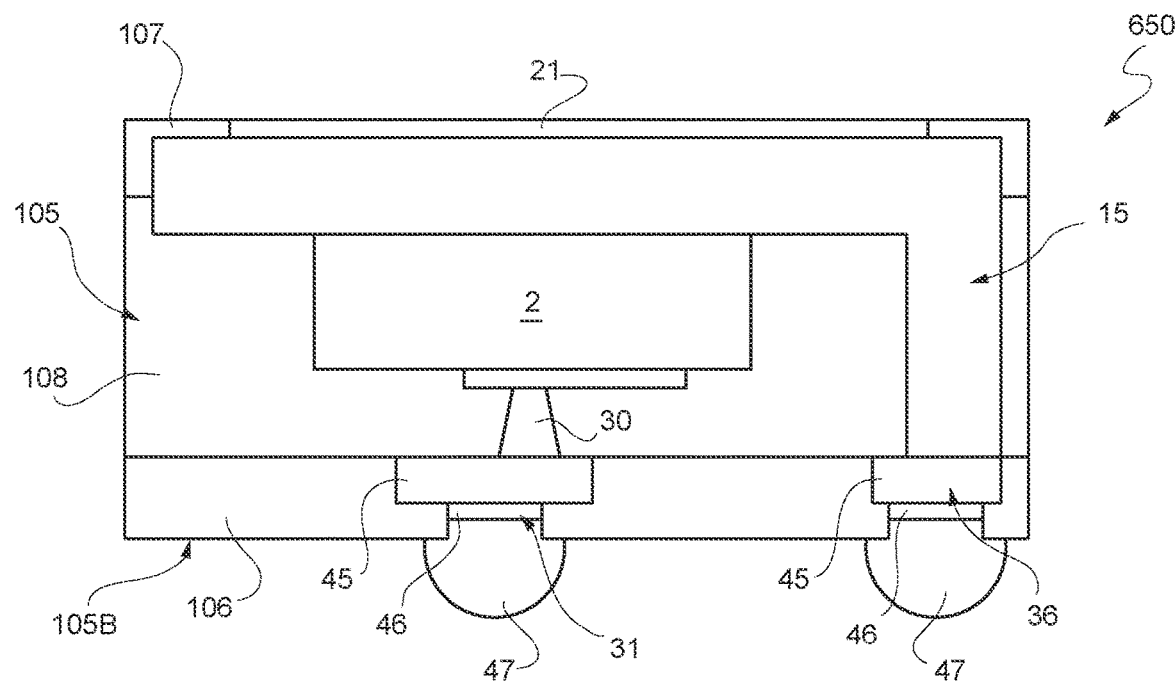
FIG. 46 is a cross-section similar to that of FIG. 8, of a further embodiment of the present power device, with leads of BGA-type.
Figure 47:
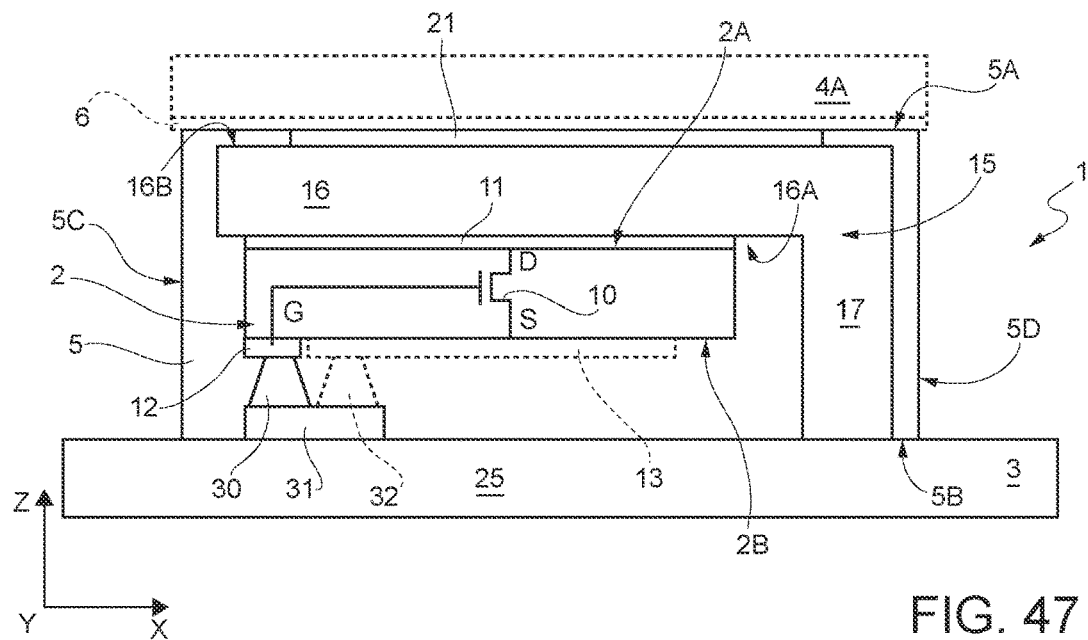
FIG. 47 is a cross-section of an embodiment of the present disclosure similar to that of FIG. 1, with a modified portion.

The characteristics and configurations described above and shown in FIGS. 1-45 for the leads 31, 33 and 36 arranged to form an LGA (Land Grid Array) connection are also applicable to different connection solutions, for example to BGA (Ball Grid Array) connection solutions, as shown in FIG. 46 for a power device 650 having the structure of the power device 100 of FIGS. 8-10.

In particular, in FIG. 46, the gate 31 and drain leads 36 (as well as the source lead 33, not visible) comprise a first layer 45, for example of aluminum, overlaid by a second layer 46, for example of gold, and by a ball 47, projecting with respect to the first insulating layer 106, in a per se known manner.

This variation is applicable to all power devices 1, 50, 100, 150, 200, 250, 300, 350, 400, 450, 500, 550 and 600 described hereinabove.

Therefore, the power device described herein allows an improvement in consumption due to better thermal performances.

It allows a reduction in manufacturing costs, since it does not need the use of top clips to obtain dual side cooling (DSC).

Finally, it is clear that modifications and variations may be made to the power device described and illustrated herein without thereby departing from the protective scope of the present disclosure, as defined in the attached claims. In particular, the different embodiments described may be combined to provide further solutions.

For example, as indicated, even in solutions with molded package 5, the cutting of the single leadframes may occur after molding, taking into account the creepage distances.

In addition, as shown in FIGS. 47-51, the transverse section 17, 217, and 417 may extend to reach the second main surface 5B of the package 5 and thus be directly accessible from the outside. Accordingly, the rear thermal dissipation region (drain lead) 36 is no more present. The same solution is applicable to all the embodiments discussed herein. Thereby, the leadframe 15, 215, 415 may be monolithical with the bottom portion.

Figure 48:
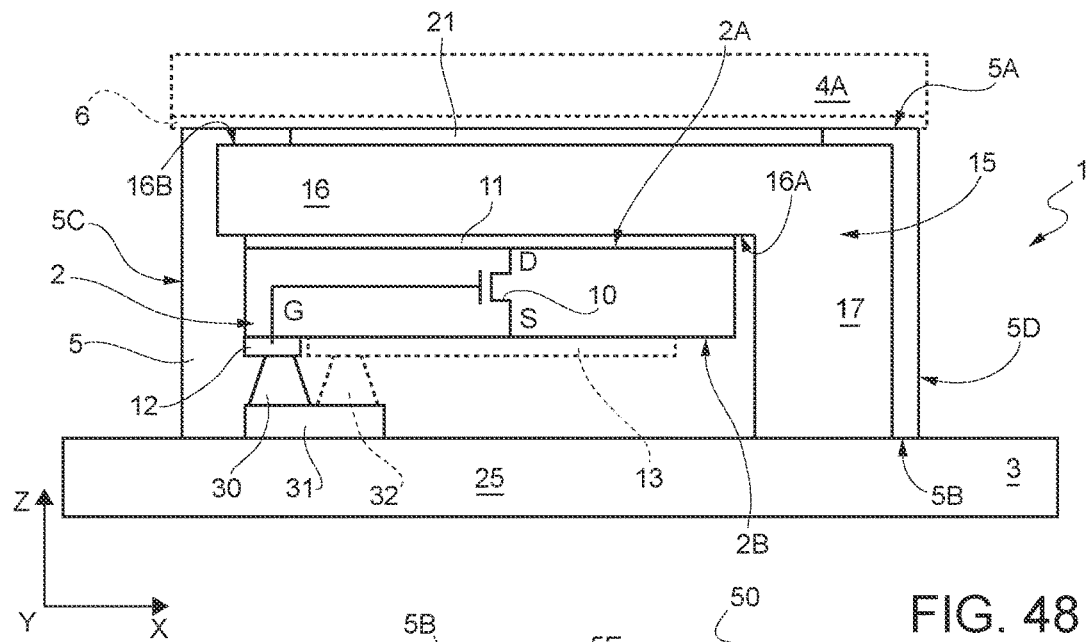
FIG. 48 is a cross-section of an embodiment of the present disclosure similar to that of FIG. 1, modified portions.

In addition, as shown in FIG. 48, the transverse section 17, 217, and 417 may be done of any desired thickness, as far as allowed by the technology. Thereby the bottom drain pad may be formed of different area.

Figure 49:
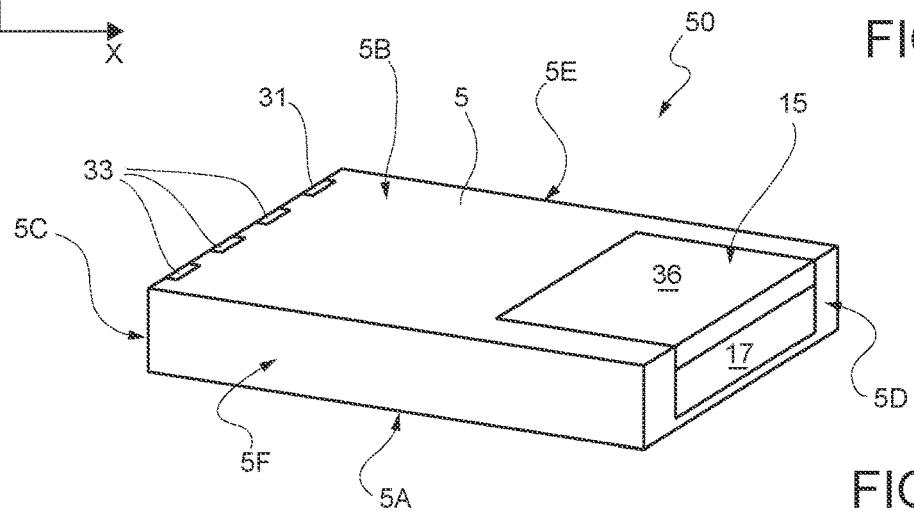
FIG. 49 is a schematic bottom view of an embodiment of the present disclosure similar to that of FIG. 7, with a modified portion.
Figure 50:
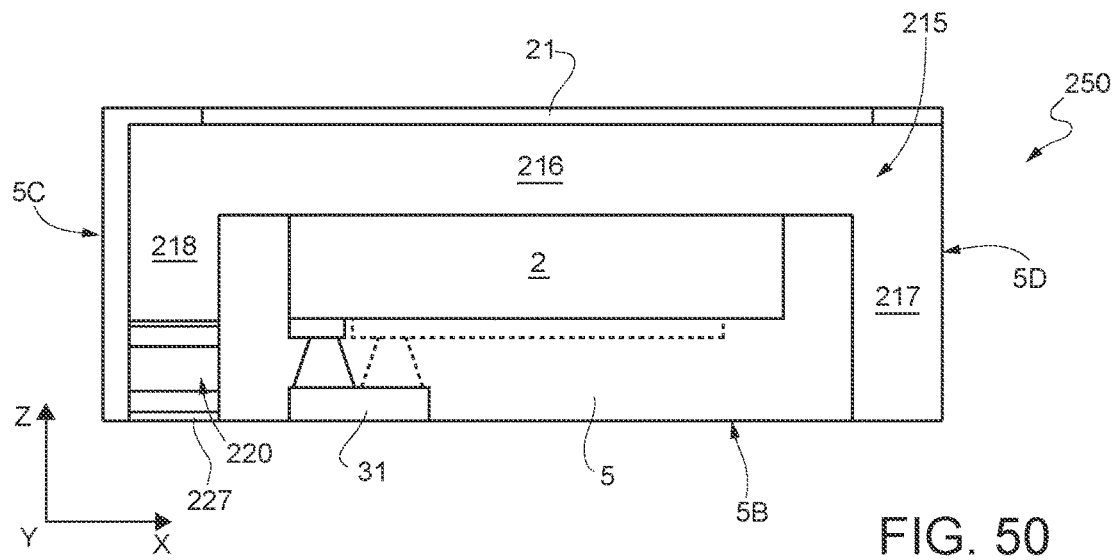
FIG. 50 is cross-section of an embodiment of the present disclosure similar to that of FIG. 21, with a modified portion.
Figure 51:
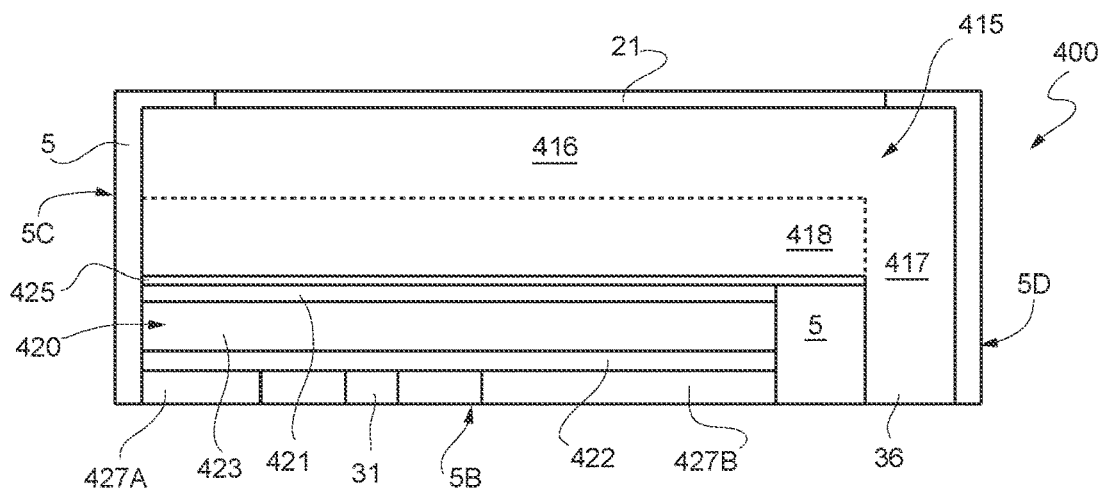
FIG. 51 is a cross-section of an embodiment of the present disclosure similar to that of FIG. 30, with a modified portion.

In FIG. 49, the transverse section 17 is directly exposed on two sides (bottom or second main surface 5B and second transverse wall or second side face 5D).

Figure 52:
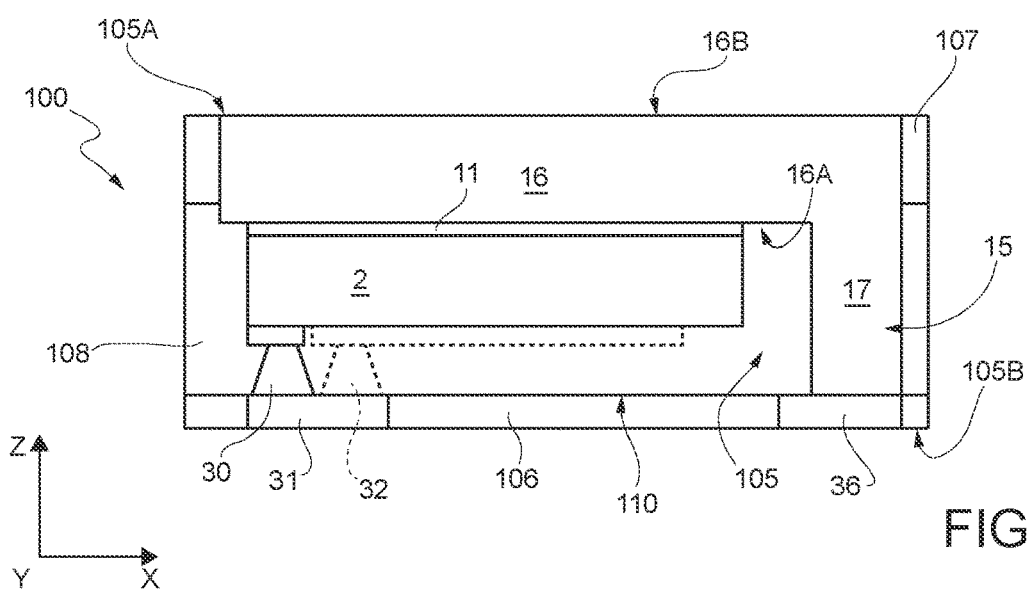
FIG. 52 is a cross-section of an embodiment of the present disclosure.

As shown in FIG. 52, the transverse section 17 may be flush with the first main surface (here 105A). The same applies to all embodiments. In particular, if the transverse section 17, 217, and 417 is modified to have the shape shown in FIGS. 47-51, it may extend monolithically between the first and the second main surfaces 5A, 105A, 5B, 105B of the package 5, 105, without interruptions.

A packaged power electronic device may be summarized as including a bearing structure (15; 215; 415) including a base section (16; 216; 416) and a transverse section (17; 217; 417), the base section having a first and a second face (16A, 16B) and the transverse section extending transversely to the base section; a die (2) bonded to the first face of the base section of the bearing structure, the die having a first and a second main face (2A, 2B) and a height between the first and the second main faces; a first, a second and a third terminal (11, 12, 13), the first terminal (11) extending on the first main face (2A) of the die and the second and third terminals (12, 13) extending on the second main face (2B) of the die (2); a package (5; 105) of insulating material, embedding the semiconductor die (2), the second terminal (12), the third terminal (13) and at least partially the carrying base (16; 216; 416), the package having a first and a second main surface (5A, 5B; 105A, 105B); and a first, a second and a third outer connection region (36, 31, 33; 17; 217; 417) electrically coupled to the first, the second and the third terminals respectively, the first, the second and the third outer connection regions being laterally surrounded by the package and facing the second main surface of the package, wherein the transverse section (17; 217; 417) of the bearing structure (15; 215; 415) extends from the base section (16; 216; 416) towards the second main surface of the package and has a higher height with respect to the die.

The transverse section (17; 217, 417) may form the first outer connection region (36) and is flush with the second main surface (5B; 105B) of the package (5; 105) or is in contact with the first outer connection region (36) and the first outer connection region (36) is flush with the second main surface (5B; 105B) of the package.

The packaged power electronic device may include a connection structure (30, 32) of electrically conductive material extending through the package (5; 105) and coupling the second terminal (12) and the third terminal (13) to the second (31) and, respectively, to the third (33) outer connection regions.

The packaged power electronic device may further include a front thermal dissipation region (21) of thermally conductive material bonded to the second face (16B) of the base section (16; 216; 416) of the bearing structure (15; 215; 415).

The package (5; 105) may have an elongated shape defining a length direction (X) and a width direction (Y), the second and the third outer connection regions (31, 33) being arranged side by side in the width direction and the first outer connection region (36) being arranged spaced from the first and the second outer connection regions in the length direction.

The base section (16; 216; 416) and the transverse section (17, 217; 417) of the bearing structure (15; 215; 415) may form an L in cross-section.

The bearing structure (215; 415) may be C-shaped in cross-section.

The bearing structure (215) may further include a thermal dissipation section (218) extending transversely to the base section (216) from the first face thereof, the base section of the bearing structure having an elongated shape having a first and a second transverse edge, longitudinally opposite to each other, the transverse section (217) extending from the first transverse edge and the thermal dissipation section (218) extending from the second transverse edge of the base section (216).

The thermal dissipation section (218) may have a lower height than the transverse section (217) and a thermal connection structure (220) may extend between the thermal dissipation section and a fourth outer connection region (227), laterally surrounded by the package (5; 105) and facing the second main surface (5B; 105B) of the package (5; 105), the thermal connection structure (220) being electrically insulating.

The fourth outer connection region (227) may be formed by a DBC (Direct Bonded Copper).

The bearing structure (415) may be cup-shaped and may include a delimitation wall (418) extending to form a C along the periphery of the base section (416) and having ends in contact with or spaced from the transverse section (417), the delimitation wall (418) having a lower height than the transverse section, and wherein a thermal connection structure (420) extends from the delimitation wall towards the second main surface (5B; 105B) of the package (5; 105).

The packaged power electronic device may further include a plurality of further outer connection regions (427A), (427B) laterally surrounded by the package (5; 105) and extending between the delimitation wall (418) and the second main surface (5B; 105B) of the package.

The transverse section (17; 217; 417) of the bearing structure (15; 215; 415) may have a first side face and a second side face opposite to each other, the first side face facing the die (2) and the second side face facing a side surface (5D; 105D) of the package (5; 105).

The second side face of the transverse section (17; 217; 417) may be level with the package (105).

A process for manufacturing a packaged power electronic device may be summarized as including bonding a die (2) to a bearing structure (15; 215; 415) having a base section (16; 216; 416) and a transverse section (17, 217; 417), the die having a first and a second main face (2A, 2B), a first terminal (11) on the first main face and a second and a third terminal (12, 13) on the second main face of the die, the die having the second main face bonded to the base section of the bearing structure, thereby the transverse section of the bearing structure projects in height with respect to the die; and forming a package (5; 105) of insulating material embedding the die and, at least partially, the bearing structure, wherein forming a package includes laterally surrounding a first, a second and a third outer connection region (36, 31, 33; 17; 217; 417) electrically coupled to the first, the second and the third terminals, respectively, thereby the first, the second and the third outer connection regions face the first main surface of the package.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a support structure including a base section and a transverse section extending transversely to the base section, the base section having a first face and a second face opposite to the first face;
a die coupled to the first face of the base section of the support structure, the die having a first main face and a second main face and a first height extending from the first main face to the second main face, and a drain contact region of the die is adhered to the first face of the base section;
a first, a second and a third terminal, the first terminal on the first main face of the die and the second and third terminals on the second main face of the die;
one or more layers of insulating materials around the die, the second terminal, and the third terminal;
a first, a second and a third outer connection region electrically coupled to the first, the second, and the third terminals, respectively, the first, the second and the third outer connection regions being within the one or more layers of insulating material,
wherein the transverse section of the support structure extends from the base section, the transverse section has a second height greater than the first height of the die, and the transverse section is in contact with the first outer connection region.

2. The device according to claim 1, comprising a conductive layer on the second face of the base section and a connection structure of electrically conductive material extending through the one or more layers of insulating materials and coupled to the second terminal and the third terminal to the second and to the third outer connection regions, respectively.

3. The device according to claim 1, comprising a conductive layer on the second face of the base section, the conductive layer is a thermal dissipation region of thermally conductive material bonded to the second face of the base section of the support structure.

4. The device according to claim 1, wherein the one or more layers of insulating materials has an elongated shape defining a length direction and a width direction transverse to the length direction, the second and the third outer connection regions are side by side in the width direction and the first outer connection region is spaced from the second and the third outer connection regions in the length direction.

5. The device according to claim 1, wherein the base section and the transverse section of the support structure form an L in a cross-section.

6. The device according to claim 1, wherein the support structure is C-shaped in a cross-section.

7. The device according to claim 1, wherein the support structure includes a thermal dissipation section extending transversely to the base section from the first face.

8. The device according to claim 7, wherein the thermal dissipation section has a third height less than the second height of the transverse section, and the thermal dissipation section includes a thermal connection structure that extends between the thermal dissipation section and a fourth outer connection region, the fourth outer connection region is within the one or more layers of insulating materials.

9. The device according to claim 1, wherein the support structure is cup-shaped and includes a wall extending along a periphery of the base section in a C-shape, the wall having a third height less than the second height of the transverse section, and a thermal connection structure extending from the wall.

10. The device according to claim 9, further comprising a plurality of further outer connection regions within the one or more layers of insulating materials.

11. The device according to claim 1, wherein the transverse section of the support structure has a first side face and a second side face opposite to each other, the first side face facing the die and the second side face facing away from the die.

12. The device according to claim 11, wherein the second side face of the transverse section is level with the one or more layers of insulating materials.

13. A device, comprising:
a support structure fully made of a metal material including a first portion and a second portion transverse to the first portion, the first portion having a first surface and a second surface opposite to the first surface, and the second portion including a first sidewall;
a die includes a contact region coupled to the first surface of the first portion of the support structure, the die including a second sidewall facing towards the first sidewall of the second portion, and the second sidewall of the die is spaced apart from the second portion, the second sidewall is transverse to the contact region;
a space separates the second sidewall of the die from the first sidewall of the second portion, the space is delimited by the first surface of the first portion, the first sidewall of the second portion, and a third sidewall of the contact region;
a conductive layer on the second surface of the first portion, the conductive layer separated from the die by the first portion of the support structure, the conductive layer having a third surface facing away from the die; and
one or more insulating layers at least partially around the die, the support structure, and the conductive layer, the one or more insulating layers including a fourth surface substantially coplanar with the third surface of the conductive layer, and the one or more insulating layers filling the space that separates the first sidewall of the second portion from the second sidewall of the die.

14. The device of claim 13, wherein the one or more insulating layers includes:

a first insulating layer on the second sidewall of the die and on the first sidewall of the second portion that faces the second sidewall of the die; and
a second insulating layer on the first insulating layer, on the second surface of the first portion, and on sidewalls of the conductive layer.

15. The device of claim 1, wherein the transverse section is perpendicular to the base section.

16. The device of claim 1, wherein the transverse section is at least partially exposed from the one or more layers of insulating material.

17. The device of claim 11, wherein the second side face of the transverse section is exposed from the insulating material.

18. The device of claim 13, wherein the second portion is perpendicular to the first portion.

19. The device of claim 13, wherein the second portion includes a surface having at least a portion exposed from the one or more insulating layers.

20. The device of claim 19, wherein the surface of the second portion is a side surface and the portion of the side surface is level with another side surface of at least one of the one or more insulating layers.

21. The device of claim 13, wherein the second portion is at least partially exposed from the one or more insulating layers.

22. A device, comprising:
a printed circuit board;
a leadframe made of a metal material on the printed circuit board, the leadframe including:
a base section having a first face and a second face opposite to the first face, the first face facing and spaced from the printed circuit board; and
a transverse section having a first sidewall face and a second sidewall face opposite to the first sidewall face, the first sidewall face and the second sidewall face are transverse to the first face and the second face of the base section, the transverse section extends from the base section toward the printed circuit board;
a die coupled to the first face of the base section of the leadframe, the die having a first main face and a second main face, and a third sidewall, the second main face faces towards the first face of the base section, the first main face faces away from the first face of the base section, and the third sidewall that extends from the first main face to the second main face and faces the first sidewall face, and the die includes a contact region at the first main face coupled to the first face of the base section;
a connection region coupled to the die, the connection region extends away from the die;
a first lead coupled to the connection region;
insulating material that is between the first main face of the die and the printed circuit board, the transverse section extends from the first face of the base section past the first main face of the die and past the second main face of the die through the insulating material.

23. The device of claim 22, wherein the transverse section of the leadframe extends from the base section, a first height that extends from the first main face to the second main face, and the transverse section has a second height greater than the first height of the die, and the transverse section is in contact with a second lead.

24. The device of claim 22, wherein the transverse section is perpendicular to the base section.

25. The device of claim 22, further comprising a packaging material at least partially embeds the leadframe.

26. The device of claim 25, wherein the second sidewall face of the transverse section is exposed at a wall of the packaging material.

27. The device of claim 25, further comprising a conductive layer on the second face of the base section of the leadframe, the conductive layer is a thermal dissipation region of thermally conductive material exposed from the packaging material.

28. The device of claim 25, wherein the first lead is exposed from the packaging material.

* * * * *